United States Patent
Yuan et al.

(10) Patent No.: US 11,366,307 B2
(45) Date of Patent: Jun. 21, 2022

(54) PROGRAMMABLE AND RECONFIGURABLE MASK WITH MEMS MICRO-MIRROR ARRAY FOR DEFECT DETECTION

(71) Applicant: KLA Corporation

(72) Inventors: Hongxing Yuan, Milpitas, CA (US);
Tim Mahatdejkul, Milpitas, CA (US);
Bret Whiteside, Gilroy, CA (US)

(73) Assignee: KLA Corporation, Milpitas, CA (US)

( * ) Notice: Subject to any disclaimer, the term of this patent is extended or adjusted under 35 U.S.C. 154(b) by 5 days.

(21) Appl. No.: 17/005,151

(22) Filed: Aug. 27, 2020

(65) Prior Publication Data

US 2022/0066195 A1 Mar. 3, 2022

(51) Int. Cl.
*G02B 26/08* (2006.01)
*G03F 7/20* (2006.01)

(52) U.S. Cl.
CPC ..... *G02B 26/0833* (2013.01); *G03F 7/70291* (2013.01)

(58) Field of Classification Search
CPC ............. G02B 26/0833; G03F 7/70275; G03F 7/70291
USPC ................................................ 355/53, 67–71
See application file for complete search history.

(56) References Cited

U.S. PATENT DOCUMENTS

| | | |
|---|---|---|
| 5,506,676 A | 4/1996 | Hendler et al. |
| 5,748,308 A | 5/1998 | Lindberg et al. |
| 6,312,134 B1 | 11/2001 | Jain et al. |
| 6,686,995 B2 | 2/2004 | Wilk et al. |
| 7,041,998 B2 | 5/2006 | Weiss et al. |
| 7,292,330 B2 | 11/2007 | Saunders et al. |
| 7,535,563 B1 | 5/2009 | Chen et al. |
| 7,548,302 B2 | 6/2009 | Bleeker et al. |
| 8,031,931 B2 | 10/2011 | Fuchs et al. |

(Continued)

FOREIGN PATENT DOCUMENTS

| | | |
|---|---|---|
| DE | 102004026019 A1 | 12/2005 |
| EP | 2130030 B1 | 11/2010 |

(Continued)

OTHER PUBLICATIONS

DeVerse, R. A. et al., "Realization of the Hadamard Multiplex Advantage Using a Programmable Optical Mask in a Dispersive Flat-Field Near-Infrared Spectrometer", Applied Spectroscopy, vol. 54, Nov. 12, 2000, pp. 1751-1758.

Zhan, Sui et al., "Beam Shaping by Using the Liquid Crystal Panel of a Commercial Display Device", Chin. Phys. Lett, p. 1656, vol. 22, No. 7., 2005.

Martínez, José Luis et al., "Microscope system with on axis programmable Fourier transform filtering", Optics and Lasers in Engineering, pp. 116-122, vol. 89, Feb. 2017.

(Continued)

*Primary Examiner* — Hung V Nguyen
(74) *Attorney, Agent, or Firm* — Suiter Swantz pc llo

(57) ABSTRACT

A defect detection system includes a programmable and reconfigurable digital micro-mirror device (DMD) and at least one optical element. The DMD includes a micro-mirror array with a plurality of micro-mirrors adjustable to achieve a first deflection state or a second deflection state. The DMD is configured to receive incoming light and reflect a first portion of the incoming light into a first light channel corresponding to the first deflection state and a second portion of the incoming light into a second light channel corresponding to the second deflection state. The at least one optical element is optically coupled to the first light channel and the second light channel. The at least one optical element is configured to deflect the first portion of the incoming light to a first imaging lens and a second portion of the incoming light to a second imaging lens.

19 Claims, 21 Drawing Sheets

(56) References Cited

U.S. PATENT DOCUMENTS

| | | | |
|---|---|---|---|
| 8,823,921 B2 | 9/2014 | Zlatanov et al. | |
| 9,182,219 B1 | 11/2015 | Manassen et al. | |
| 9,250,509 B2 | 2/2016 | Markle et al. | |
| 9,500,954 B2* | 11/2016 | Deguenther | G02B 26/0833 |
| 9,703,207 B1* | 7/2017 | Cavan | G03F 7/70275 |
| 2003/0227602 A1 | 12/2003 | Scarasso | |
| 2004/0197672 A1 | 10/2004 | Weed et al. | |
| 2006/0012781 A1 | 1/2006 | Fradkin et al. | |
| 2009/0296170 A1 | 12/2009 | Sumi | |
| 2013/0114085 A1 | 5/2013 | Wang et al. | |
| 2014/0320835 A1* | 10/2014 | Fujiwara | G01M 11/005 355/67 |
| 2015/0036142 A1 | 2/2015 | Kandel et al. | |
| 2018/0217506 A1 | 8/2018 | Deguenther et al. | |

FOREIGN PATENT DOCUMENTS

| | | |
|---|---|---|
| EP | 3486706 A1 | 5/2019 |
| KR | 101306038 B1 | 9/2013 |
| WO | 2004001508 A2 | 8/2004 |

OTHER PUBLICATIONS

Gao, Yunshu et al., "Programmable Spectral Filter in C-Band Based on Digital Micromirror Device", Micromachines, 2019, 10, 163, pp. 1-10.

Sun, Wen-Shing, "Optical design for the DLP pocket projector using LED light source", Physics Procedia, 19, 2011, pp. 301-307.

PCT International Search Report and Written Opinion for International Application No. PCT/US2021/047044 dated Dec. 9, 2021, 10 pages.

* cited by examiner

PROGRAMMABLE AND RECONFIGURABLE MASK WITH MEMS MICRO-MIRROR ARRAY FOR DEFECT DETECTION

TECHNICAL FIELD

The present invention generally relates to semiconductor masks, and, more particularly, to a programmable and reconfigurable mask with MEMS micro-mirror array for defect detection.

BACKGROUND

Semiconductor masks with different shapes and sizes are broadly adopted in most defect detection systems based on microscopic architecture. Select semiconductor masks are inscribed into a thin metal sheet having a shape of a long plate or a wheel. The number of inscribed semiconductor masks, however, may be limited based on space constraints of the defect detection systems and the practical requirements for reliability and repeatability. In addition, designing the inscribed semiconductor masks may require a long leading time and do not provide a level of flexibility to modify the design that may be useful during an actual application of the semiconductor masks.

Therefore, it would be desirable to provide a semiconductor mask that cures the shortfalls of the previous approaches identified above.

SUMMARY

A defect detection system is disclosed, in accordance with one or more embodiments of the present disclosure. In one embodiment, the defect detection system includes a programmable and reconfigurable digital micro-mirror device (DMD). The DMD includes a micro-mirror array with a plurality of micro-mirrors. At least some of the plurality of micro-mirrors are adjustable to achieve a first deflection state or a second deflection state. The DMD is configured to receive incoming light and reflect a first portion of the incoming light into a first light channel corresponding to the first deflection state and a second portion of the incoming light into a second light channel corresponding to the second deflection state. In another embodiment, the defect detection system includes at least one optical element. The at least one optical element is optically coupled to the first light channel and the second light channel. The at least one optical element is configured to deflect the first portion of the incoming light to a first imaging lens in the first light channel and a second portion of the incoming light to a second imaging lens in the second light channel.

A defect detection system is disclosed, in accordance with one or more embodiments of the present disclosure. In one embodiment, the defect detection system includes a programmable and reconfigurable digital micro-mirror device (DMD). The DMD includes a micro-mirror array with a plurality of micro-mirrors. At least some of the plurality of micro-mirrors are adjustable to achieve a first deflection state or a second deflection state. The DMD is configured to receive a first portion of incoming light via a first light channel corresponding to the first deflection state and a second portion of incoming light via a second light channel corresponding to the second deflection state. The DMD is configured to combine the first portion of the incoming light and the second portion of the incoming light. The DMD is configured to reflect the combined first portion of the incoming light and second portion of the incoming light into a third light channel. In another embodiment, the defect detection system includes at least one optical element. The at least one optical element is optically coupled to the first light channel, the second light channel, and the third light channel. The at least one optical element is configured to reflect the combined first portion of the incoming light and second portion of the incoming light to an imaging lens in the third light channel.

A defect detection system is disclosed, in accordance with one or more embodiments of the present disclosure. In one embodiment, the defect detection system includes a first programmable and reconfigurable digital micro-mirror device (DMD) and a second programmable and reconfigurable DMD. At least some of the first DMD and the second DMD includes a micro-mirror array with a plurality of micro-mirrors. At least some of the plurality of micro-mirrors of the first DMD and the second DMD are adjustable to achieve a first deflection state or a second deflection state. The first DMD is configured to receive a first portion of incoming light corresponding to the first deflection state via a first light channel. The second DMD is configured to receive a second portion of the incoming light corresponding to the second deflection state via a second light channel embodiment, the defect detection system includes a plurality of optical elements. The plurality of optical elements includes a prism. The prism is optically coupled to the first light channel and the second light channel. The prism includes a beam splitter configured to split the incoming light into the first portion of the incoming light and the second portion of incoming light. The plurality of optical elements includes a first wave plate within the first light channel. The first wave plate is configured to receive the first portion of the incoming light from the prism and direct the first portion of the incoming light to the first DMD. The plurality of optical elements includes a second wave plate within the second light channel. The second wave plate is configured to receive the second portion of the incoming light from the prism and direct the second portion of the incoming light to the second DMD.

A defect detection system is disclosed, in accordance with one or more embodiments of the present disclosure. In one embodiment, the defect detection system includes a controller communicatively coupled to a programmable and reconfigurable digital micro-mirror device (DMD). The controller includes one or more processors configured to execute program instructions causing the one or more processors to receive at least one of a haze map, a defect map, or a signal-to-noise ratio (SNR) map. The controller includes one or more processors configured to execute program instructions causing the one or more processors to derive a mask shape from the received at least one of the haze map, the defect map, or the SNR map. The controller includes one or more processors configured to execute program instructions causing the one or more processors to program and reconfigure the DMD by adjusting at least some of a plurality of micro-mirrors of the DMD to achieve a first deflection state or a second deflection state. The DMD is configured to receive incoming light and reflect a first portion of the incoming light into a first light channel corresponding to the first deflection state and a second portion of the incoming light into a second light channel corresponding to the second deflection state. At least one optical element is optically coupled to the first light channel and the second light channel. The at least one optical element is configured to deflect the first portion of the incoming light to a first imaging lens in the first light channel and a second portion of the incoming light to a second imaging lens in the second light channel.

A method is disclosed in accordance with one or more embodiments of the present disclosure. In one embodiment, the method may include, but is not limited to, receiving at least one of a haze map, a defect map, or a signal-to-noise ratio (SNR) map. In another embodiment, the method may include, but is not limited to, deriving a mask shape from the received at least one of the haze map, the defect map, or the SNR map. In another embodiment, the method may include, but is not limited to, programming and reconfiguring a digital micro-mirror device (DMD) based on the derived mask shape by adjusting at least some of a plurality of micro-mirrors of the DMD to achieve a first deflection state or a second deflection state. The DMD is configured to receive incoming light and reflect a first portion of the incoming light into a first light channel corresponding to the first deflection state and a second portion of the incoming light into a second light channel corresponding to the second deflection state. At least one optical element is optically coupled to the first light channel and the second light channel. The at least one optical element is configured to deflect the first portion of the incoming light to a first imaging lens in the first light channel and a second portion of the incoming light to a second imaging lens in the second light channel.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1A:
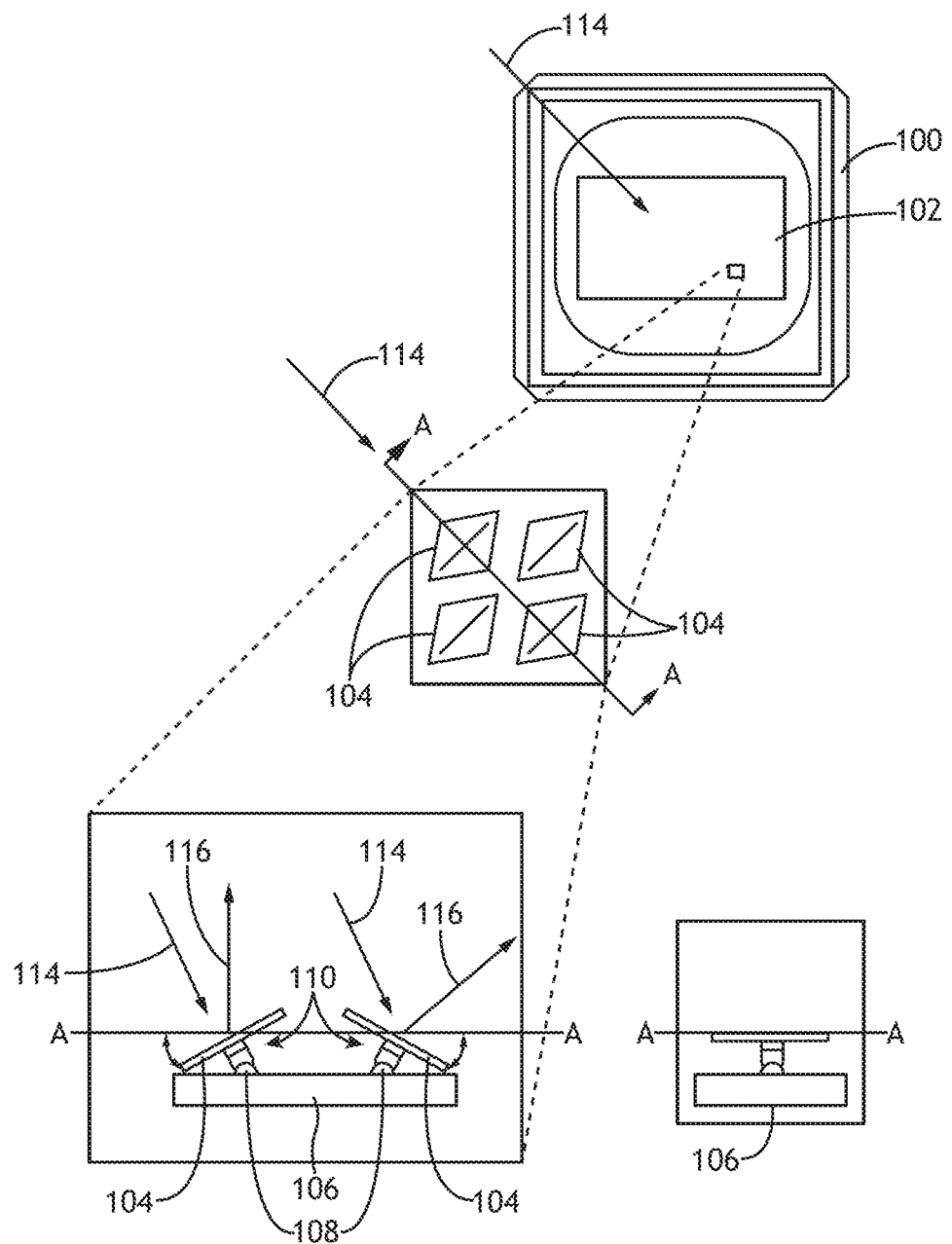
FIG. 1A is a simplified view of a digital micro-mirror device (DMD), in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist (including a photoresist), a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

Semiconductor masks with different shapes and sizes are broadly adopted in most defect detection systems based on microscopic architecture. The semiconductor masks may be inserted in a pupil plane or a corresponding relayed plane of the pupil plane of the defect detection system to perform a processing of an optical signal. For example, the processing of the optical signal may include maximizing the signal-to-noise ratio (SNR) of the optical signal and/or the detectability of defects of interest (DOI) of one or more shapes, sizes, sample materials, and/or sample substrates.

Select semiconductor masks are inscribed into a thin metal sheet having a shape of a long plate or a wheel. Inscribing the thin metal sheet may require special electrical discharge machining (EDM) processes. Driving the thin metal sheet may require precision control via actuators and encoders in a closed-loop feedback system. For example, the long plate-shaped thin metal sheet may be actuatable via a linear actuator. By way of another example, the wheel-shaped thin metal sheet may be actuatable by a rotational actuator. The inscribed semiconductor masks may each be addressable to account for various kinds of wafer substrates, deposited materials, cleaning materials, processing materials, different dynamic and delicate film stacks, and/or defect type (e.g., which may vary in shape, size, density, depth, or the like).

Although a large number of masks may be necessary to address the above variations, the actual number of inscribed semiconductor masks within a defect detection system may be limited based on space constraints of the defect detection systems and the practical requirements for reliability and repeatability.

In addition, the inscribed semiconductor masks may not provide a level of flexibility to modify the design that may be useful during an actual application of the semiconductor masks.

Further, designing and/or controlling the inscribed semiconductor masks may require a long leading time and may require considerable alignment and/or calibration. For example, the alignment and/or calibration may be highly dependent on a level of precision afforded by the actuators and encoders. Deviations from calibration and/or alignment may result in a lower SNR, a possible loss of detectability of defects, a defocusing from pupil plane (e.g., caused by a tip and/or tilt of the mask), and/or additional ambiguity in the detection (e.g., caused by the separate and/or spread out nature of the various semiconductor masks being inscribed at different locations within the thin metal sheet.

Further, the inscribed semiconductor masks may require considerable hardware costs, both initial and maintenance. The moveability of the inscribed semiconductor masks (and corresponding components) may result in a reduced life-cycle of the defect detection system. Repairing the defect detection systems may result in more frequent and/or increased downtime.

As an alternative to inscribed semiconductor masks, defect detection systems may be based on microscopy architecture. The microscopy architecture-based defect detection systems may be configured for spatial processing at a Fourier plane of the defect detection system. For example, a ring band may be used as a high spatial frequency pass and a simple open hole may be used as a low spatial frequency pass for the defect detection system. In general, the semiconductor masks may require a complex shape to maximize a desired optical signal and keep noise minimized.

The microscopy architecture-based defect detection systems may include a Liquid Crystal Device (LCD). For example, a combination of a transmissive Liquid Crystal Modulator (T-LCM) and a reflective Liquid Crystal Modulator (R-LCM) may be used as a Fourier plane filter to maximize an SNR of a concentration test of bio-samples as disclosed by John M. Lindberg et al. in U.S. Pat. No. 5,748,308, titled "PROGRAMMABLE STANDARD FOR USE IN AN APPARATUS AND PROCESS FOR THE NONINVASIVE MEASUREMENT OF OPTICALLY ABSORBING COMPOUNDS" and issued May 5, 1998, which is incorporated herein by reference in its entirety. By way of another example, an LCD may be used as an intensity modulator to realize the beam shaping from Gaussian to flat-top, as disclosed by Sui Zhan et al. in Beam Shaping by Using the Liquid Crystal Panel of a *Commercial Display Device*, Chin. Phys. Lett, p. 1656, Vol. 22, No. 7, 2005, which is incorporated herein by reference in its entirety. By way of another example, an LCD may be used for phase modulation without a polarizer and an analyzer, as disclosed by José Luis Martinez et al. in *Microscope system with on axis programmable Fourier transform filtering*, Optics and Lasers in Engineering, p. 116-122, Volume 89, February 2017, which is incorporated herein by reference in its entirety. By way of another example, an LCD with stabilized polymer may be customized to be survived in ultraviolet (UV) and sandwiched in a pair of UV-grade glass, along with a transparent indium-tin-oxide (ITO) layer used as electrodes, as disclosed by Dieter E. Wilk, et al. in U.S. Pat. No. 6,686,995 B2, titled "TWO-DIMENSIONAL UV COMPATIBLE PROGRAMMABLE SPATIAL FILTER" and issued Feb. 3, 2004, which is incorporated herein by reference in its entirety.

Instead of an LCD system, Digital Micro-mirror Devices (DMD) based on Micro-electromechanical systems (MEMS) technology is another option for Spatial Light Modulation (SLM). For example, A DMD may be used as a programmable spectral filter or as an optical De-multiplexer in C-band telecommunication system, where a desired wavelength is programmed to be selectively reflected to the desired light channel, as described by Yunshu Gao et al. in *Programmable Spectral Filter in C-Band Based on Digital Micromirror Device*, p. 163, Micromachines, 10, 2019. One application of a DMD is to be used for SLM for a projector, which is incorporated herein by reference in its entirety. For example, an optical design of projector based on DMD is described by Wen-Shing Sun, et al. in *Optical Design for the DLP pocket projector using LED light source*, Physic Procedia, p. 301-307, 19, 2011, which is incorporated herein by reference in its entirety.

LCD and DMD systems may both be viable options for masks, having the programmable capability and each pixel within the LCD or DMD with micro-meter resolution being addressable. However, for deep ultraviolet (DUV) applications, there are two issues for LCD systems. For instance, large organic LCD molecules are vulnerable to DUV, leading to the lifetime of the LCD molecules being of concern. In addition, the polarizer and analyzer pair for LCD for controlling the transmission of each pixel can mess up the polarization of incoming light, which can be an important message carrier. Therefore, LCD is a less-than-viable choice for a defect detection system with a UV light source.

Embodiments of the present disclosure are directed to a programmable and reconfigurable mask with a micro-electromechanical system (MEMS) micro-mirror array for defect detection. Specifically, embodiments of the present disclosure are directed to select configurations of a digital micro-mirror device (DMD) based on MEMS technology for use as a programmable mask.

Embodiments include a DMD with a MEMS micro-mirror array usable as a programmable and reconfigurable mask for defect detection. In general, the programmable and reconfigurable mask may be a digital micro-mirror device (DMD) in a compact system design, instead of requiring large metal sheets (e.g., linear sheets, rotary sheets, or the like) and corresponding driving or control systems (e.g., including actuators, encoders, or the like). The mask may be programmed and reconfigured online or offline and may include any size and/or shape of masks, which may be selected in response to a particular film.

In particular, the DMD may include a large micro-mirror array with a resolution as high as 10 micrometer (μm) order. Each micro-mirror of the array may be addressable and reflected at two states, with an additional flat state when the mirror is parked. The DMD may be inserted into a relayed pupil plane of a defect detection system. When the DMD is programmed with a select shape and/or size, an incoming beam may be successfully divided into two light channels as desired. For example, a DMD including a three-state actuation may have a natural light channel separation. The incoming beams of light divided into light channels when reflected by the DMD 100 may impinge upon and/or pass through a series of optical elements prior to the plane of the programmable and reconfigurable mask. The optical elements may include lenses, prisms including one or more prism sections, or other optical elements. Due to the programmability and reconfigurability of the DMD, a mask with any particular shape and/or size may be achieved (e.g., to meet consumer and/or industry requirements with respect to designs, applications, or the like). The mask may be reconfigured (e.g., refined or redefined, designed or redesigned, or the like) either online or offline any at point during the defect detection system lifecycle. With a customized High Relective (HR) coating for UV, the DMD may achieve very high reflectivity and bears intrinsic immunity to UV, while reserving the photons of an incoming polarization.

For purposes of the present disclosure, "optical detection system" and "defect detection system" may be considered equivalent.

FIGS. 1-10 generally illustrate a programmable and reconfigurable mask with a MEMS micro-mirror array for defect detection, in accordance with one or more embodiments of the present disclosure.

Figure 1B:
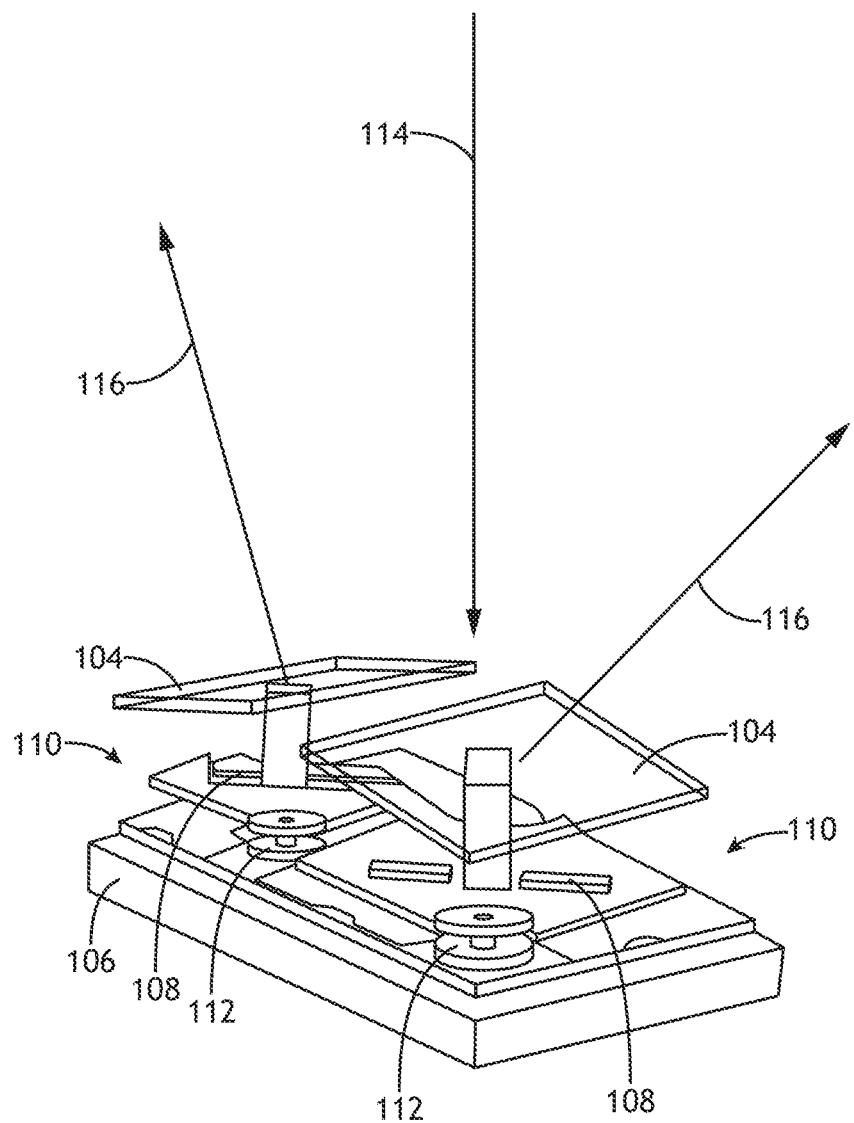
FIG. 1B is a simplified view of a digital micro-mirror device, in accordance with one or more embodiments of the present disclosure.

FIGS. 1A and 1B illustrate a digital micro-mirror device (DMD) 100, in accordance with one or more embodiments of the present disclosure. In one embodiment, the DMD 100 includes a large micro-mirror array 102 with one or more mirrors 104 where, combined, the one or more mirrors 104 may operate similar to a single, large mirror. For example, the pitch between the mirror array 102 may be approximately 10 μm. It is noted herein the DMD 100 may include, but is not limited to, a Texas Instruments' TI-DLP®.

In an example embodiment of the DMD 100, the mirrors 104 of the array 102 are coupled to a substrate 106 via a hinge 108 of a yoke 110. The mirror 104 may be set at an angle by applying a positive- or negative-biased voltage. The mirror 104 may be set at a 0 angle without applying a biased voltage. A reflection angle of the mirror 104 may be precisely controlled by a stopper 112 or landing tip 112 of the yoke 110 positioned at each side of the mirror 104. The height of each stopper 112 or landing tip 112 of the yoke 110 may be of nanometer (nm) precision, being defined by deposition and etching processes of a semiconductor process. If no voltage is applied, the mirror 104 may be parallel to the substrate 106. In this regard, the mirror 104 may be programmable to stay in three states, including a positive deflection (PD) state, a negative deflection (ND) state, and a no-deflection or static (S) state.

In the example embodiment of the DMD 100, the mirrors 104 may be configured to receive incoming light 114, and further configured to transmit a reflected beam 116. The DMD 100 may effect an additional angular shift when creating the reflected beams 116 (e.g., including, but not limited to, an additional 24° angular shift), where the additional angular shift may result in the PD state, the ND state, and/or the S state.

It is noted herein the above example embodiment of the DMD 100 is provided for descriptive purposes, and should not be interpreted as a limitation on the present invention but merely an illustration.

Figure 2B:
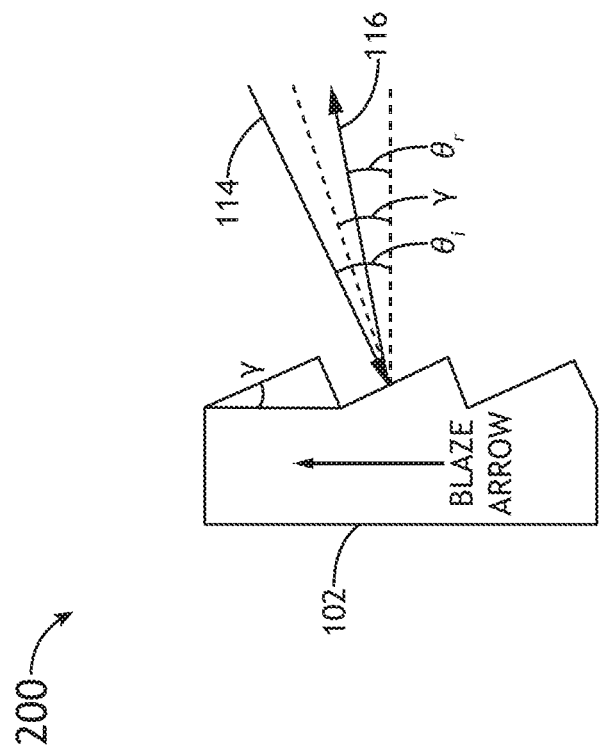
FIG. 2B is a diffraction grating, in accordance with one or more embodiments of the present disclosure.
Figure 2A:
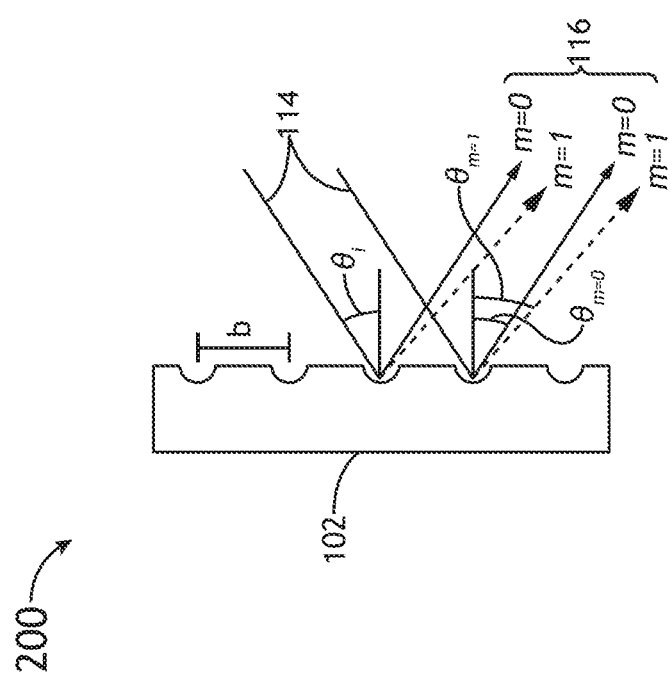
FIG. 2A is a diffraction grating, in accordance with one or more embodiments of the present disclosure.

FIGS. 2A and 2B illustrate example diffraction gratings, in accordance with one or more embodiments of the present disclosure. In one embodiment, whether in the mirrors 104 are in respective PD states, ND states, or S states, the mirror array 102 may be considered a reflective blazed grating 200. The reflected beam 116 from a reflective blazed grating 200 may not be continuous due to diffraction effect. Instead, the reflected beam 116 may be observable at a series of discrete angular positions, where the distribution of the deflected light may be considered a grating function, as illustrated in EQ. 1:

$$b[\sin(\theta_m)+\sin(\theta_L)]=m\lambda \qquad \text{EQ. 1}$$

where b is a period, m is a diffraction order, $\theta_m$ is a diffraction angle of m order, $\theta_i$ is an incident angle with respect to a grating plane, and $\lambda$ is a working wavelength.

For the reflective blazed grating 200 as illustrated in FIG. 2B, a maximum reflection may be achieved as defined in EQ. 2:

$$\theta_r - \theta_i = 2\gamma \qquad \text{EQ. 2}$$

where $\theta_r$ is a reflection angle with respect to a grating plane and $\gamma$ is a blazed angle of grating.

Aligning a specular reflection of the reflective blazed grating 200 with a certain order of diffraction (e.g., an mth order) may be achieved as defined in EQ. 3:

$$\theta_r = \theta_m = -(2\gamma + \theta_i) \qquad \text{EQ. 3}$$

The actual intensity of an mth order diffraction may be considered a result of an interference of reflections of an N number of micro-mirrors 104, as defined in EQ. 4:

$$I = I_o \sin^2(N\delta/2)/\sin^2(\delta/2) \qquad \text{EQ. 4}$$

where δ is defined in EQ. 5:

$$\delta = 2\pi/\lambda b \sin(\theta) \qquad \text{EQ. 5}$$

in which b is a mirror cell pitch.

If the intensity is modulated by a diffraction of a single mirror, as defined in EQ. 6:

$$I = I_o \sin^2(\beta)/\beta^2 \qquad \text{EQ. 6}$$

where β is defined by EQ. 7:

$$\beta = 2\pi/\lambda a \sin(\theta) \qquad \text{EQ. 7}$$

in which a is mirror cell width. The total resultant intensity is defined by EQ. 8:

$$I = I_o[\sin^2(N\delta/2)/\sin^2(\delta/2)]\sin^2(\beta)/\beta^2 \qquad \text{EQ. 8}$$

The total resultant intensity of the blazed diffraction grating 200 may be a multiple reflection from mirror array interference modulated by an envelope of diffraction patterns of a single slit. In EQ. 8, the larger the N, the higher the directionality of each order. In addition, the closer mirror cell width a is to mirror cell pitch width b, the narrower of diffraction envelope and thus the more concentrated of diffraction energy for a particular order. As a approaches b, more than 90% of light power may be squeezed into a single order.

In this regard, the beam 116 may be directed from the DMD 100 in a particular direction defined by pitch and A, and may be achieved by a customized blazed angle γ. In one example, a DMD may include a mirror array 102 with a 1080p resolution, titanium mirrors 104 with a 10.8 μm pitch, a blazed angle of ±12 degrees (°), and a UV working wavelength within a range between 363 nm and 420 nm. In one instance, in order to maximize a diffraction efficiency to m=16 for a working wavelength of 266 nm, the blazed angle may be tuned to ±11.604°. It is noted herein select customized dielectric coatings may be used instead of an aluminum coating for select working wavelengths.

FIGS. 3-6 generally illustrate example embodiments of optical assemblies including the DMD 100, in accordance with one or more embodiments of the present disclosure.

In general, the DMD 100 may have one, two, or three biased states (e.g., some or all of the PD state, the ND state, and the S state) to achieve a full use of incoming light at a pupil plane into two different light pathways or branches, depending on a programming of the DMD 100.

Figure 3:
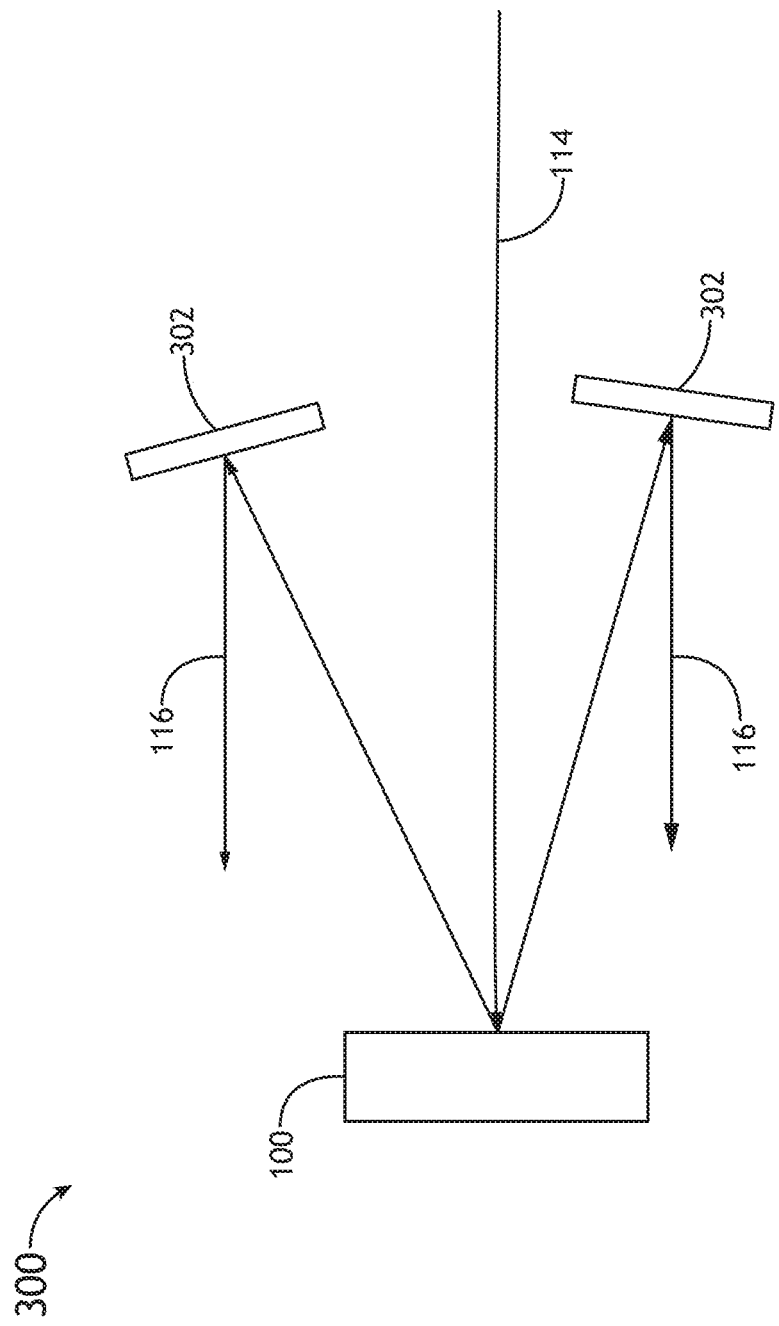
FIG. 3 is an optical assembly including a DMD, in accordance with one or more embodiments of the present disclosure.

In one embodiment, as illustrated in FIG. 3, an optical assembly 300 may be configured for a free-space application, for which there is a larger space available to achieve total separation of incoming light 114 and reflected beams 116. In FIG. 3, the light 114 strikes the DMD 100. The DMD 100 being in at least two states (e.g., PD state and ND state) causes the reflected beams 116 to form. Each reflected beam 116 is directed to a deflection mirror 302. For example, a first reflected beam 116 is directed via a first light channel to a first deflection mirror 302, which deflects the second reflected beam 116 to a first imaging lens and subsequent imaging plane. By way of another example, a second reflected beam 116 is directed via a second light channel to a second deflection mirror 302, which deflects the second reflected beam 116 to a second imaging lens and subsequent imaging plane. The optical assembly 300 may allow for an easy, cost-effective implementation with the needing to control a coating on only as many additional deflection mirrors 302 as needed to direct the reflected beams 116. However, the optical assembly 300 does require valuable space and may require additional alignment steps.

In another embodiment, as illustrated in FIGS. 4A-4I, an optical assembly 400 may be configured for a compact arrangement in which the optical assembly 400 may rely on total internal reflection (TIR) to fully separate the incoming light 114 and the reflected beams 116. The prism 402 may be fabricated from multiple prism sections or smaller prisms, with tilt surfaces being between adjacent prism sections. In general, the prism sections may include, but are not limited to, isosceles triangular prisms, rectangular prisms, trapezoidal prisms, or prisms having a cross-section known in the art. For example, the prism 402 may include prism sections 404, 406, and 408, with a tilt surface 410 between prism sections 406 and 408 and a second tilt surface 412 between prism sections 404 and 406. By way of another example, the prism 402 may include prism sections 404, 406, and 408, with a tilt surface 410 between prism sections 404 and 408 and a second tilt surface 412 between prism sections 404 and 406.

The multiple prism sections of the prism 402 may be separated by an air gap 414 to allow for TIR within the prism 402, or may be optically bonded (e.g., via an optical adhesive). For example, prism section 404 may be separated from prism sections 406, 408 by the air gap 414, while prism sections 406 and 408 may be optically bonded. By way of another example, prism sections 404, 406, 408 may each be separated from one another by an air gap 414.

The tilt surfaces may be set at select angle (e.g., a hypotenuse angle less than a TIR angle) and/or provided with a select coating material to allow for TIR within the prism 402. The select coating material and the tilt surface angle may be selected to allow for the incoming light 114 to pass through the prism 402 prior to reflecting from the DMD 100. For example, the angles of the tilt surfaces 410, 412 may be selected to allow for perpendicular alignment of the reflected beams 116 relative to the incoming light 114, such that the reflected beams 116 may be more easily directed to downstage components of a defect detection system including the optical assembly 400. For instance, tilt surface 410 may direct a first reflected beam 116 in a first direction out of the prism 402, while tilt surface 412 may direct a second reflected beam 116 in a second direction out of the prism 402. It is noted herein the first direction and the second direction may be different directions or the same direction.

The optical assembly 400 illustrated in FIGS. 4A-4I may allow for a containment of light without a need for alignment. However, the design of the prism 402 (e.g., number of prism sections, angle of tilt surfaces between adjacent sections, or the like) may be dependent on each particular DMD 100.

Figure 4A:
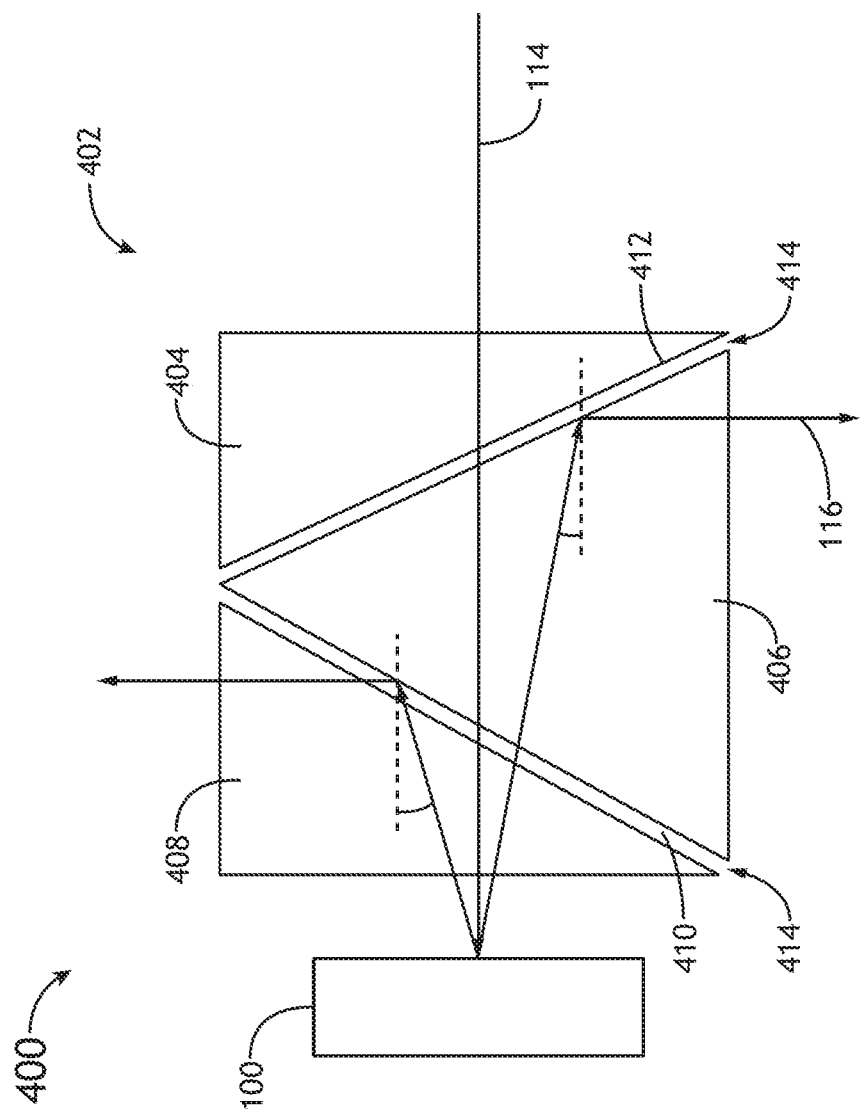
FIG. 4A is an optical assembly including a DMD, in accordance with one or more embodiments of the present disclosure.

In the example embodiment illustrated in FIG. 4A, incoming light 114 enters through a surface of the prism section 404 and passes through the prism 402, the incident angle being smaller than the TIR angle of the prism 402. The incoming light 114 reflects off the DMD 100 to form the reflected beams 116, where the DMD 100 effects an additional angular shift when creating the reflected beams 116. The reflected beams 116 are directed back into the prism 402 toward the tilt surfaces 410, 412. A first reflected beam 116, via a first light channel, is reflected in an on position through a surface of the prism section 408 by the tilt surface 410. A second reflected beam 116, via a second light channel, passes through the prism section 408 and is reflected in an off position through a surface of the prism section 406 by the tilt surface 412. The first and second reflected beams 116 exit the prism 402 via the respective light channels orthogonal to the entrance of the incoming light 114.

It is noted herein the example embodiment illustrated in FIG. 4A may be used as a mechanism for light channel separation and/or a selective deflector to orthogonal directions.

Figure 4B:
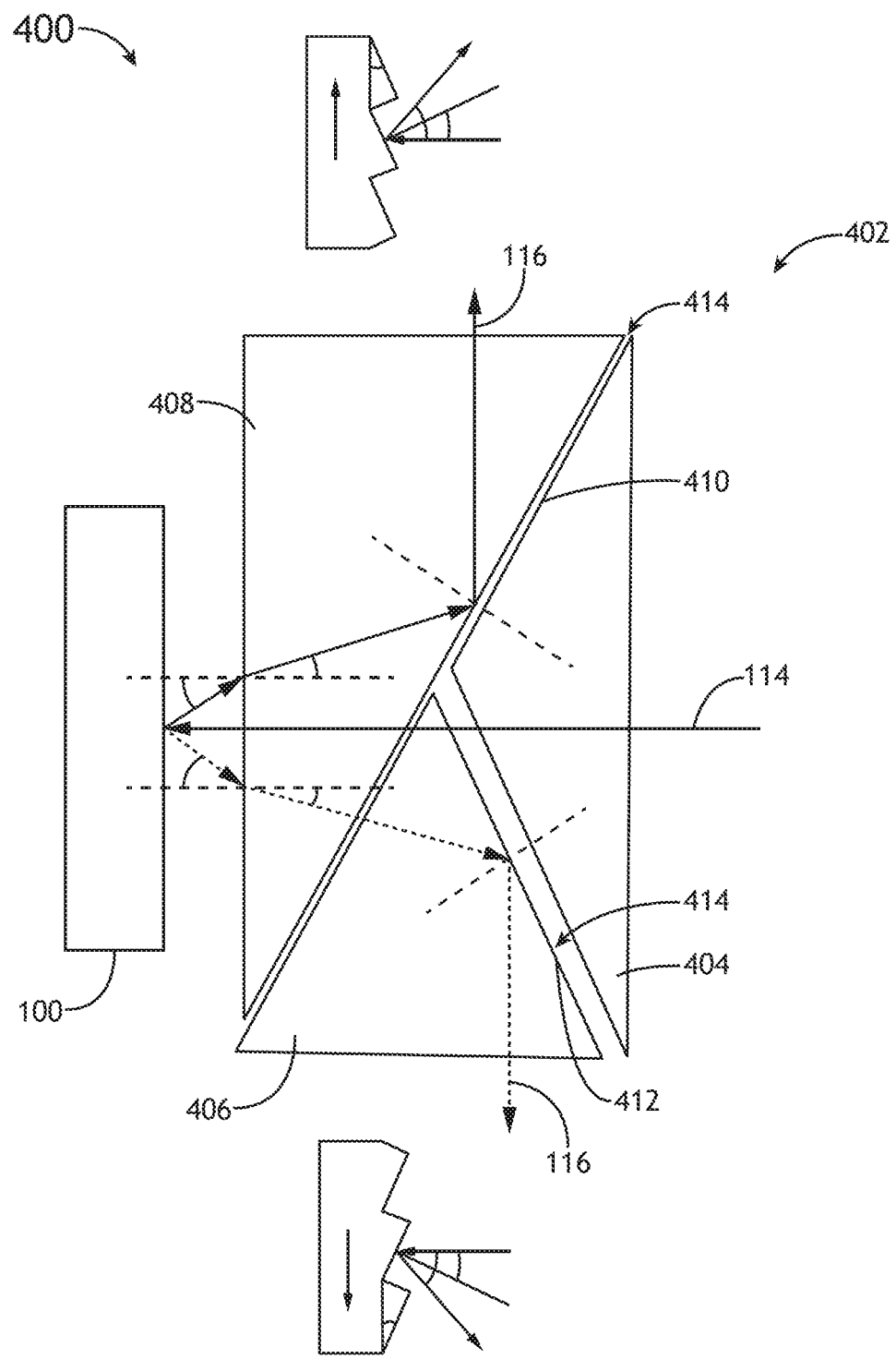
FIG. 4B is an optical assembly including a DMD, in accordance with one or more embodiments of the present disclosure.

In the example embodiment illustrated in FIG. 4B, incoming light 114 enters through a surface of the prism section 404 and passes through the prism 402, the incident angle being smaller than the TIR angle of the prism 402. The incoming light 114 reflects off the DMD 100 to form the reflected beams 116, where the DMD 100 effects an additional angular shift when creating the reflected beams 116. The reflected beams 116 are directed back into the prism 402 toward the tilt surfaces 410, 412. A first reflected beam 116, via a first light channel, is reflected in an off position through a surface of the prism section 406 by the tilt surface 410. A second reflected beam 116, via a second light channel, passes through the prism section 406 and is reflected in an on position through a surface of the prism section 408 by the tilt surface 412. The first and second reflected beams 116 exit the prism 402 orthogonal to the entrance of the incoming light 114.

It is noted herein the example embodiment illustrated in FIG. 4B may be used as a mechanism for light channel separation mechanism and/or a selective deflection to orthogonal directions mechanism.

Figure 4C:
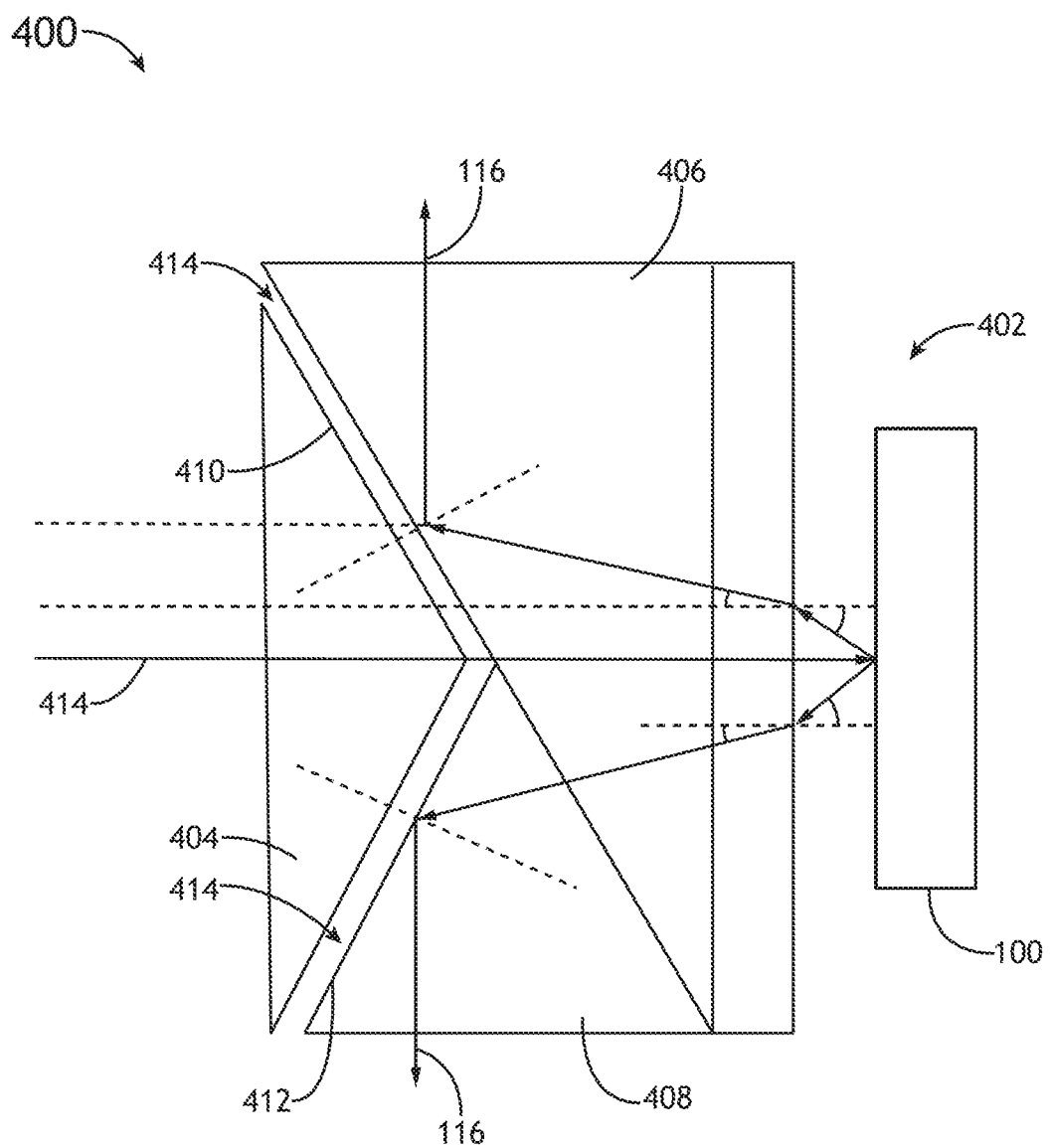
FIG. 4C is an optical assembly including a DMD, in accordance with one or more embodiments of the present disclosure.

In the example embodiment illustrated in FIG. 4C, incoming light 114 enters through a surface of the prism section 404 and passes through the prism 402, the incident angle being smaller than the TIR angle of the prism 402. The incoming light 114 reflects off the DMD 100 to form the reflected beams 116, where the DMD 100 effects an additional angular shift when creating the reflected beams 116. The reflected beams 116 are directed back into the prism 402 toward the tilt surfaces 410, 412. A first reflected beam 116, via a first light channel, is reflected in an on position through a surface of the prism section 408 by the tilt surface 410. A second reflected beam 116, via a second light channel, passes through the prism section 408 and is reflected in an off position through a surface of the prism section 406 by the tilt surface 412. The first and second reflected beams 116 exit the prism 402 orthogonal to the entrance of the incoming light 114. It is noted herein the extra length prism 406 may allow for extra lateral shift of two reflected beams, and may ensure the full separation of the incoming light 114 and the reflected beam 116. In this regard, the extra length prism 406 may be useful for an extra-wide beam scenario.

It is noted herein the example embodiment illustrated in FIG. 4C may be used as a light channel separation mechanism and/or a selective deflection to orthogonal directions.

Although example embodiments of the disclosure as illustrated in FIGS. 4A-4C show the light 114 entering the prism 402 from the left side or the right side, it is noted herein that switching the enter surface to either the bottom side or the top side of the prism 402 may allow for the combination of the prism 402 and the DMD 100 to be used for selective deflection of 90° only and/or selective forward propagation.

Figure 4D:
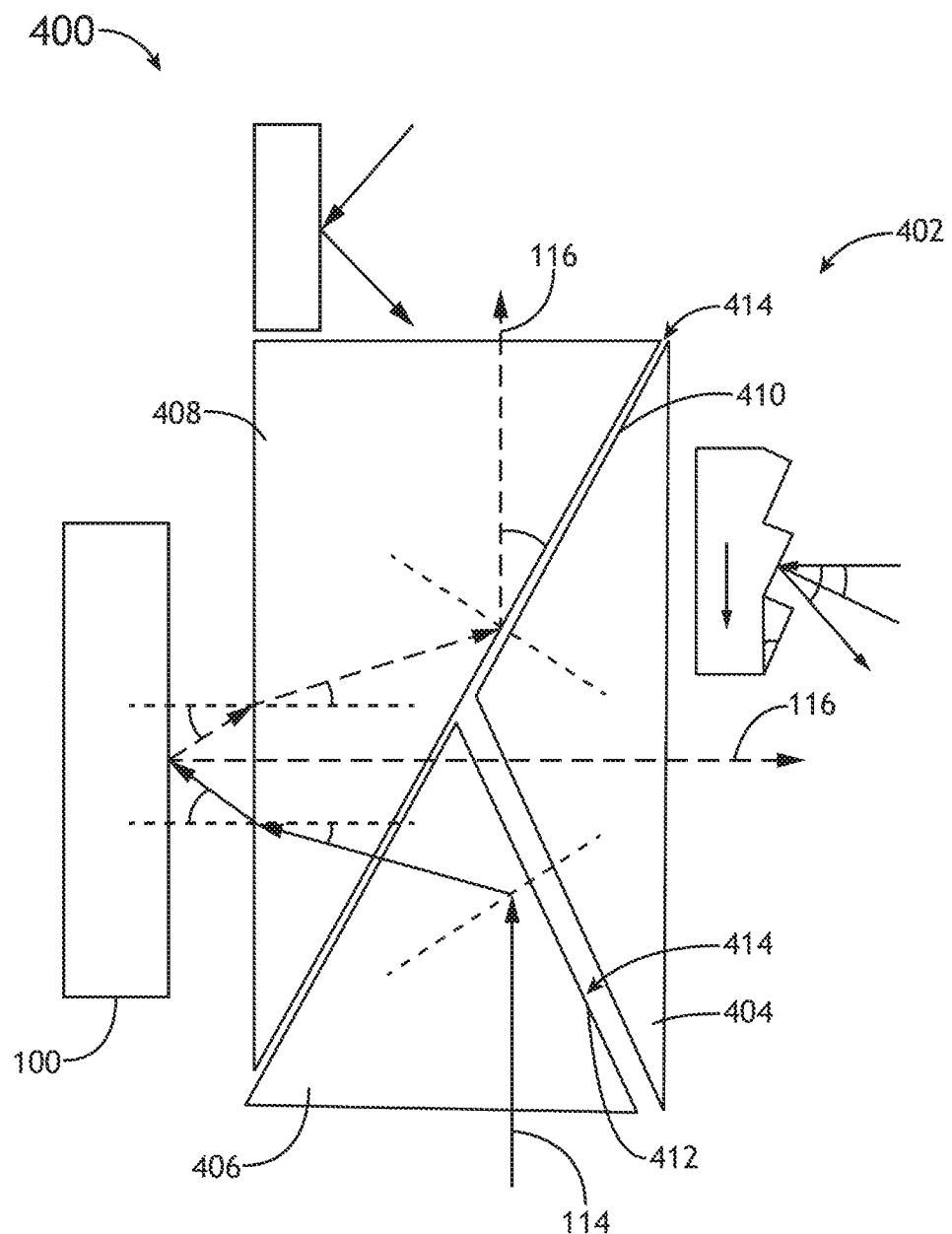
FIG. 4D is an optical assembly including a DMD, in accordance with one or more embodiments of the present disclosure.

In the example embodiment illustrated in FIG. 4D, incoming light 114 enters through a surface of the prism section 406, reflects off the tilt surface 412, and passes through the prism section 406. The incoming light 114 reflects off the DMD 100 to form the reflected beams 116, where the DMD 100 effects an additional angular shift when creating the reflected beams 116. The reflected beams 116 are directed back into the prism 402. A first reflected beam 116, via a first light channel, is reflected in a parking position through a surface of the prism section 408 by the tilt surface 410. A second reflected beam 116, via a second light channel, passes through the prism 402 in an on position with the incident angle being smaller than the TIR angle of the prism 402. The first reflected beam 116 exits the prism 402 parallel to the entrance of the incoming light 114, and the second reflected beam exits the prism 402 orthogonal to the entrance of the incoming light 114.

Figure 4E:
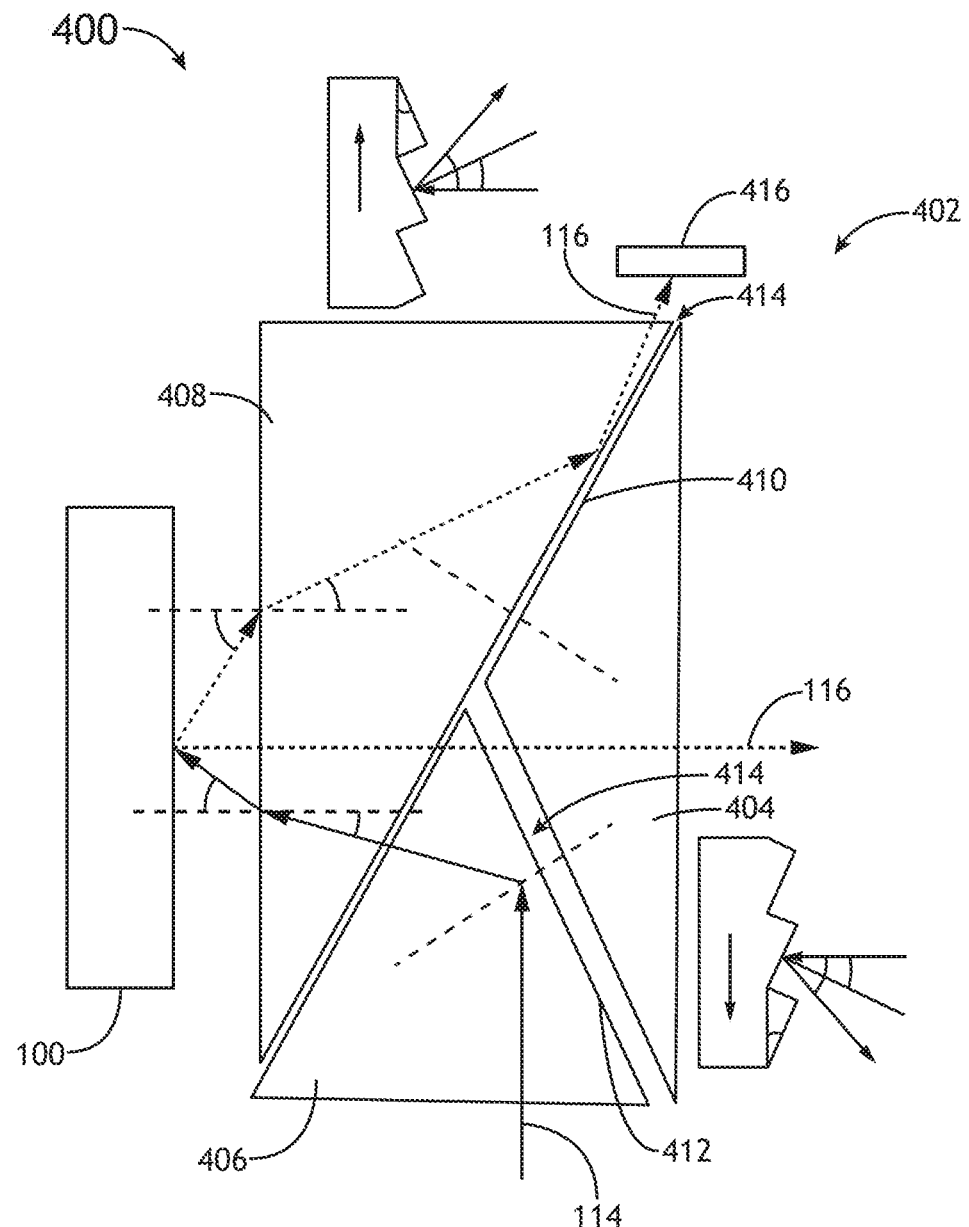
FIG. 4E is an optical assembly including a DMD, in accordance with one or more embodiments of the present disclosure.

In the example embodiment illustrated in FIG. 4E, incoming light 114 enters through a surface of the prism section 406, reflects off the tilt surface 412, and passes through the prism section 406. The incoming light 114 reflects off the DMD 100 to form the reflected beams 116, where the DMD 100 effects an additional angular shift when creating the reflected beams 116. The reflected beams 116 are directed back into the prism 402. A first reflected beam 116, via a first light channel, is reflected in an off position through a surface of the prism section 408 by the tilt surface 410 to a beam dump 416. A second reflected beam 116, via a second light channel, passes through the prism 402 in an on position with the incident angle being smaller than the TIR angle of the prism 402. The first reflected beam 116 exits the prism 402 at an angle with respect to the entrance angle of the incoming light 114, and the second reflected beam exits the prism 402 orthogonal to the entrance of the incoming light 114.

It is noted herein the example embodiment illustrated in FIG. 4E may be used as a mechanism for selective deflection to orthogonal directions.

Figure 4F:
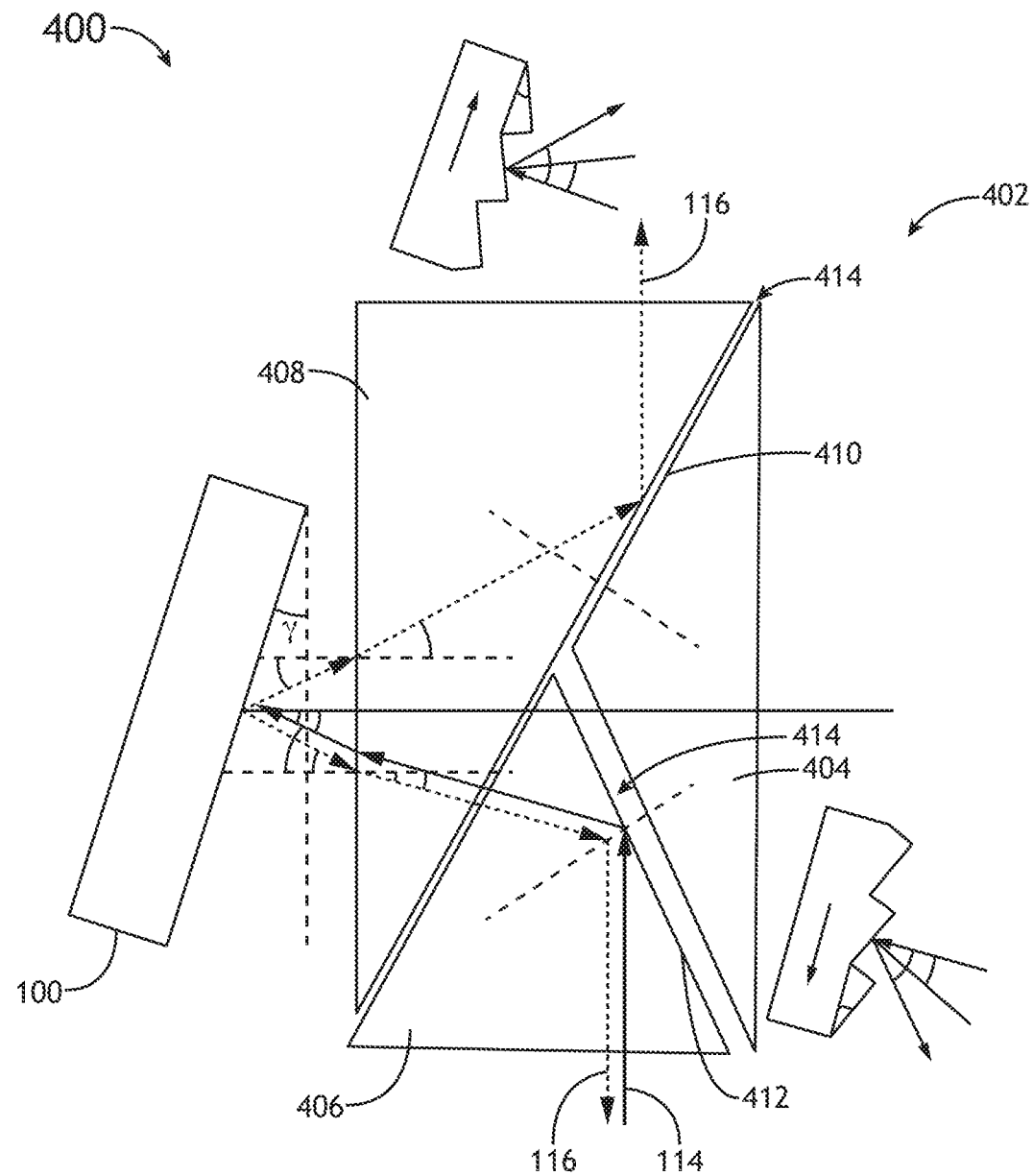
FIG. 4F is an optical assembly including a DMD, in accordance with one or more embodiments of the present disclosure.

In the example embodiment illustrated in FIG. 4F, incoming light 114 enters through a surface of the prism section 406, reflects off the tilt surface 412, and passes through the prism section 406. The incoming light 114 reflects off the DMD 100 to form the reflected beams 116, where the DMD 100 effects an additional angular shift when creating the reflected beams 116. The DMD 100 may be set at an angle γ, the same as the tilt angle of the mirror cell, with respect to an orientation of the prism 402. The reflected beams 116 are directed back into the prism 402. A first reflected beam 116, via a first light channel, is reflected in an off position through a surface of the prism section 408 by the tilt surface 410 to a beam dump 416. A second reflected beam 116, via a second light channel, passes through the prism section 406 and is reflected in an on position through the surface of the prism section 408 by the tilt surface 412. The first reflected beam 116 exits the prism 402 parallel to the entrance of the incoming light 114, and the second reflected beam exits the prism 402 at an angle opposite to the entrance angle of the incoming light 114.

It is noted herein the example embodiment illustrated in FIG. 4F may be used as a mechanism for selective deflection to forward directions, where the incoming light 114 is trimmed and deflected to 90 degrees, with the remainder of the beam being dumped via the beam dump 416.

Figure 4G:
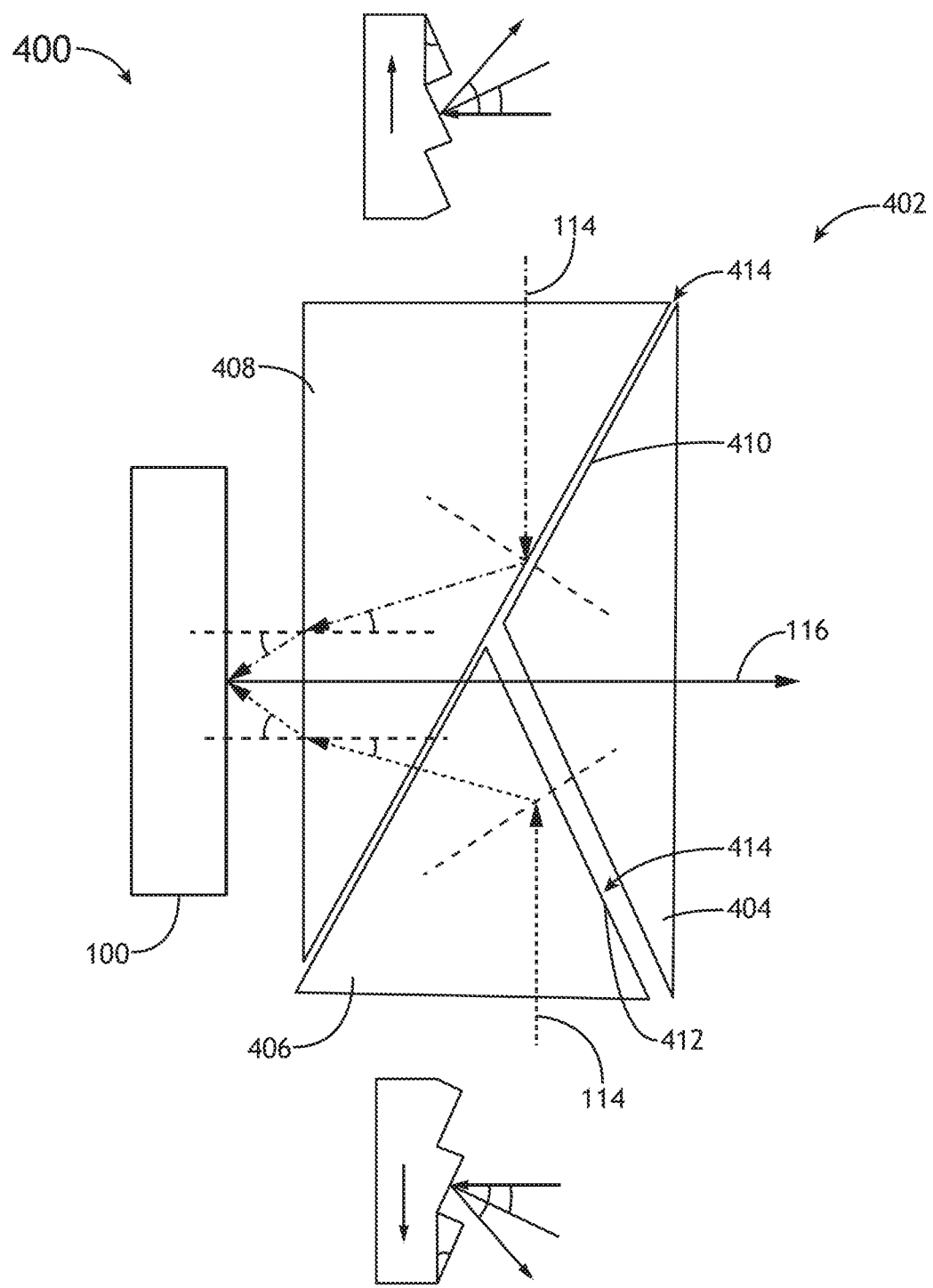
FIG. 4G is an optical assembly including a DMD, in accordance with one or more embodiments of the present disclosure.

In the example embodiment illustrated in FIG. 4G, a first incoming light 114, via a first light channel, enters in an on position through a surface of the prism section 406, reflects off the tilt surface 412, and passes through the prism section 406. A second incoming light 114, via a second light channel, enters in an off position through a surface of the prism section 408 and reflects off the tilt surface 410. The first and second incoming light 114 reflects off the DMD 100 to form the reflected beam 116, where the DMD 100 effects an additional angular shift when creating the reflected beams 116. The reflected beam 116 is directed back into the prism 402 via a third light channel. The reflected beam 116 passes through the prism 402 with the incident angle being smaller than the TIR angle of the prism 402. The reflected beam 116 exits the prism 402 via the third light channel orthogonal to the entrance of the first and second incoming light 114. The reflected beam 116 may be reflected to an imaging lens in the third light channel.

It is noted herein the example embodiment illustrated in FIG. 4G may be used as a mechanism for selective combination.

Figure 4H:
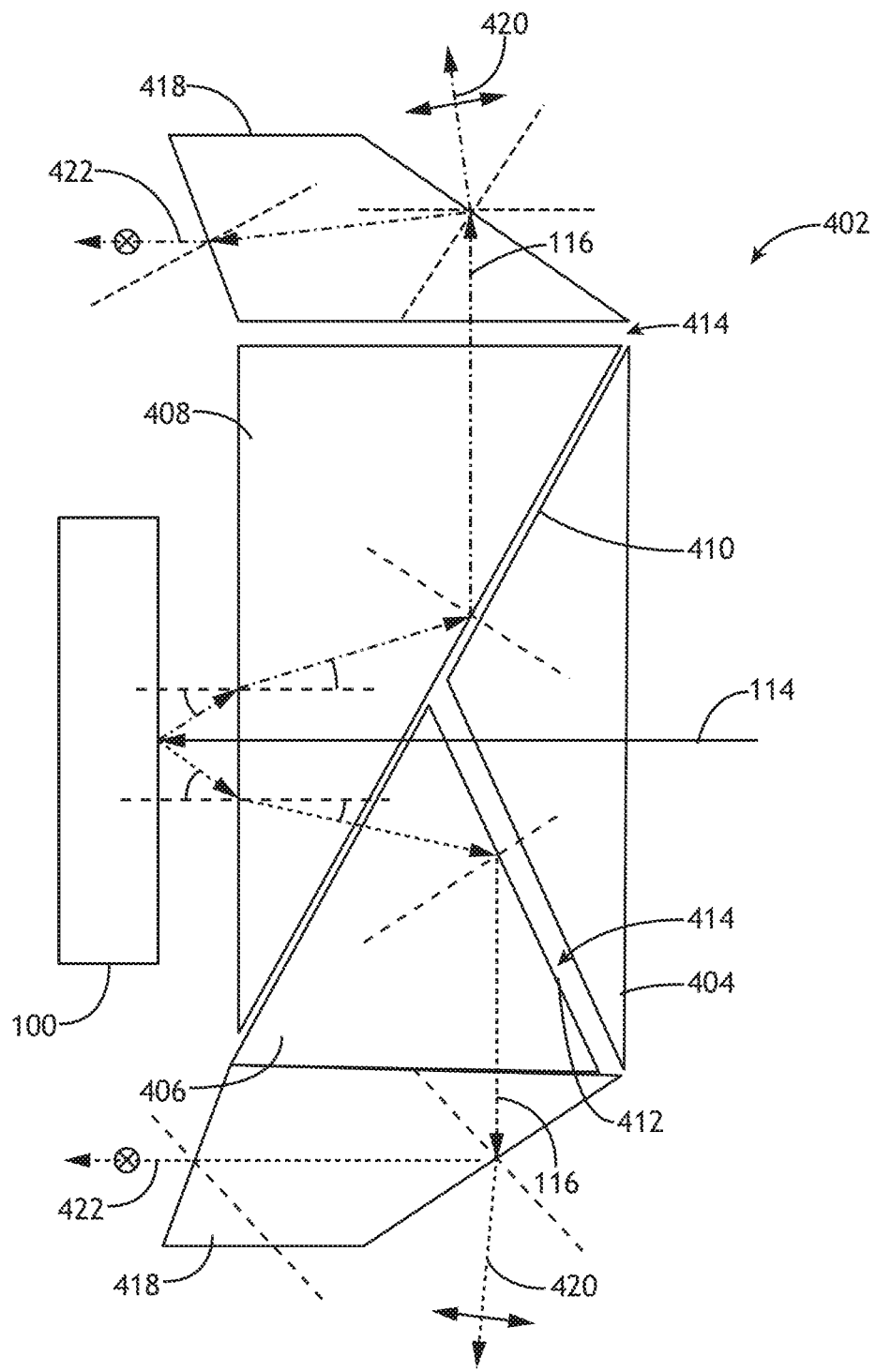
FIG. 4H is an optical assembly including a DMD, in accordance with one or more embodiments of the present disclosure.

In the example embodiment illustrated in FIG. 4H, incoming light 114 enters through a surface of the prism section 404 and passes through the prism 402, the incident angle being smaller than the TIR angle of the prism 402. The incoming light 114 reflects off the DMD 100 to form the reflected beams 116, where the DMD 100 effects an additional angular shift when creating the reflected beams 116. The reflected beams 116 are directed back into the prism 402 toward the tilt surfaces 410, 412. A first reflected beam 116, via a first light channel, is reflected in an on position through a surface of the prism section 408 by the tilt surface 410. A second reflected beam 116, via a second light channel, passes through the prism section 408 and is reflected in an off position through a surface of the prism section 406 by the tilt surface 412. The first and second reflected beams 116 exit the prism 402 orthogonal to the entrance of the incoming light 114.

The first and second reflected beams 116 each pass through an auxiliary prism 418, which effects an angular shift on the first and second reflected beams 116 to create first and second auxiliary reflected beams 420, 422 for each auxiliary prism 418. For example, the auxiliary prisms 418 may be configured such that the first auxiliary reflected beams 420 are each set at the Brewster angle with respect to its corresponding first or second reflected beam 116, and are of P polarization which passes through the tilt interface and propogate upward/downward. The second auxiliary reflected beams 422 are each orthogonal with respect to its corresponding first or second reflected beam 116, and are of S polarization which reflects from the tilt interface and can be rendered in the same direction as the incoming light 114 via careful selection of the tilt angle at the exit plane. The auxiliary prisms 418 and the prism 402 may be optically bonded.

It is noted herein the example embodiment illustrated in FIG. 4H may be used as a light channel separation mechanism and/or a selective deflection to orthogonal directions. In addition, it is noted herein the example embodiment illustrated in FIG. 4H may be used as a mechanism for polarization separation.

Figure 4I:
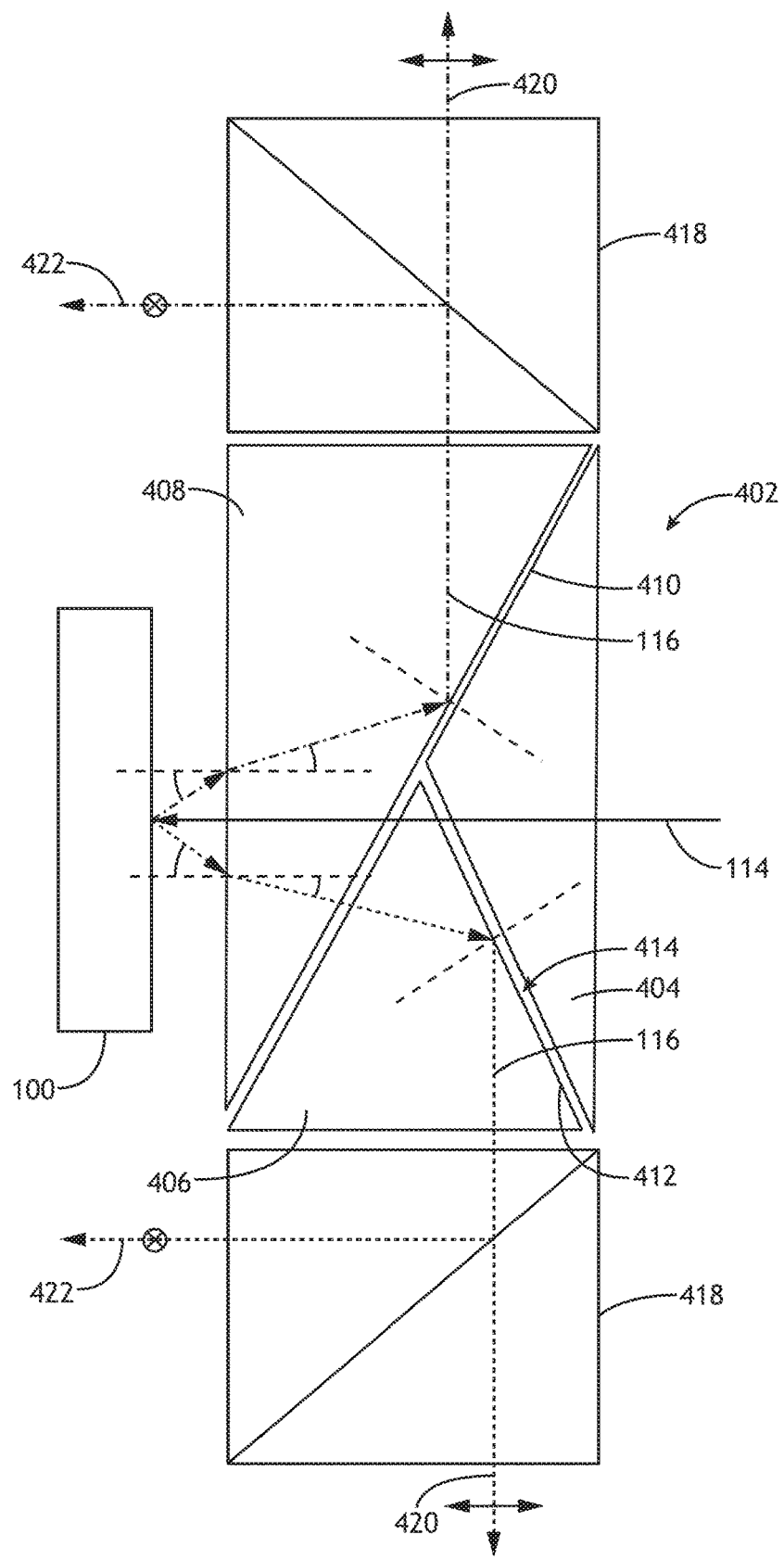
FIG. 4I is an optical assembly including a DMD, in accordance with one or more embodiments of the present disclosure.

In the example embodiment illustrated in FIG. 4I, incoming light 114 enters through a surface of the prism section 404 and passes through the prism 402, the incident angle being smaller than the TIR angle of the prism 402. The incoming light 114 reflects off the DMD 100 to form the reflected beams 116, where the DMD 100 effects an additional angular shift when creating the reflected beams 116. The reflected beams 116 are directed back into the prism 402 toward the tilt surfaces 410, 412. A first reflected beam 116, via a first light channel, is reflected in an on position through a surface of the prism section 408 by the tilt surface 410. A second reflected beam 116, via a second light channel, passes through the prism section 408 and is reflected in an off position through a surface of the prism section 406 by the tilt surface 412. The first and second reflected beams 116 exit the prism 402 orthogonal to the entrance of the incoming light 114.

The first and second reflected beams 116 each pass through an auxiliary prism 418, which creates first and second reflected beams 420, 422 for each prism 418. For example, the prisms 418 may be configured such that the first auxiliary reflected beams 420 are each parallel with respect to its corresponding first or second reflected beam 116, and the second auxiliary reflected beams 422 are each orthogonal with respect to its corresponding first or second reflected beam 116. The auxiliary prisms 418 and the prism 402 may be separated by optically bonded. It is noted herein the auxiliary prisms 418 may include, but are not limited to, polarizing beam splitting cubes (PBSCs).

It is noted herein the example embodiment illustrated in FIG. 4I may be used as a channel separation mechanism and/or a selective deflection to orthogonal directions. In addition, it is noted herein the example embodiment illustrated in FIG. 4I may be used as a mechanism for polarization separation.

It is noted herein the example embodiments of the optical assembly 400 illustrated in FIGS. 4A-4I is intended to be illustrative rather than limiting. For example, the optical assembly 400 is not limited to the arrangement or relationship of the prisms 402 or 418. Therefore, the above description should not be interpreted as a limitation on the present disclosure but merely an illustration.

Figure 5:
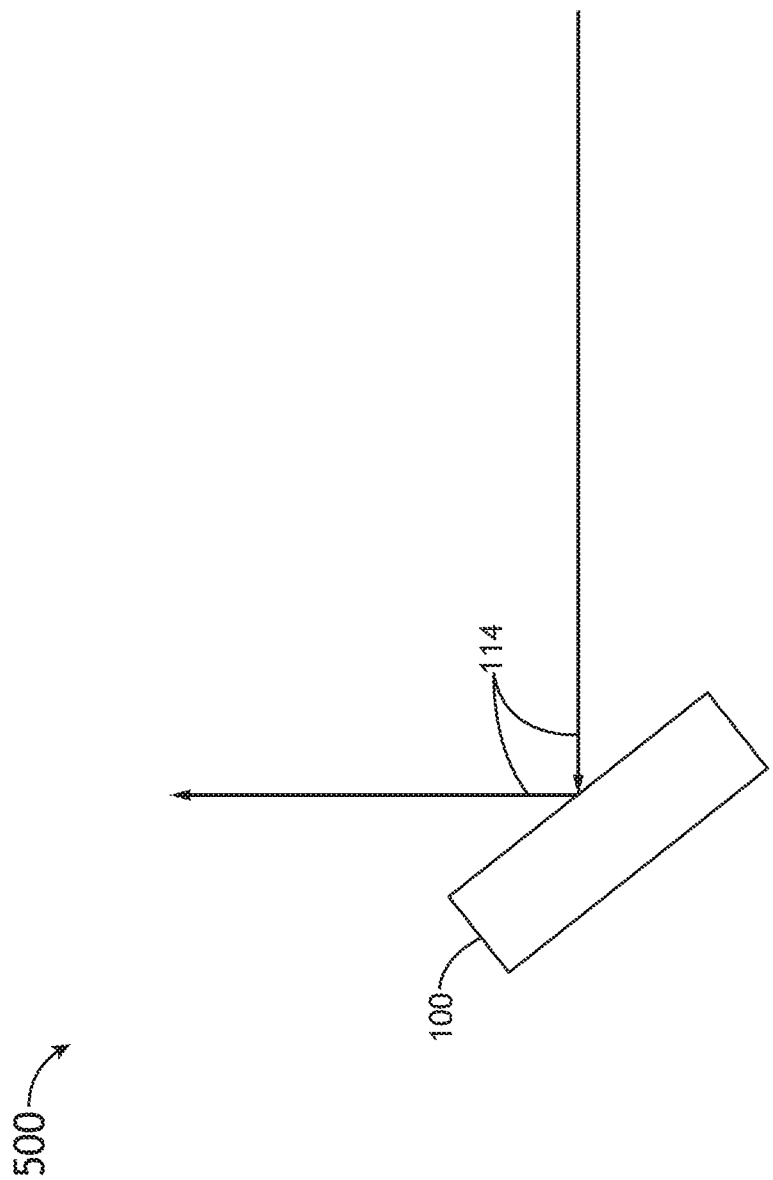
FIG. 5 is an optical assembly including a DMD, in accordance with one or more embodiments of the present disclosure.

In another embodiment, as illustrated in FIG. 5, an optical assembly 500 includes the DMD 100. The DMD 100 may be configured to refine the incoming light 114 and deflect it a set angle (e.g., 90°). The DMD 100 may be set at an angle and a majority of the mirrors 104 in the DMD 100 may be flat (e.g., at 0°), such that only the mirrors 104 along a boundary of the DMD 100 may be needed to be programmed to deflect away unwanted light. The deflecting away of unwanted light may refine the incoming light 114 by retaining only the S state light and deflecting away any PD state or ND state light. The optical assembly 500 in FIG. 5 may allow for piecewise programming.

Figure 6:
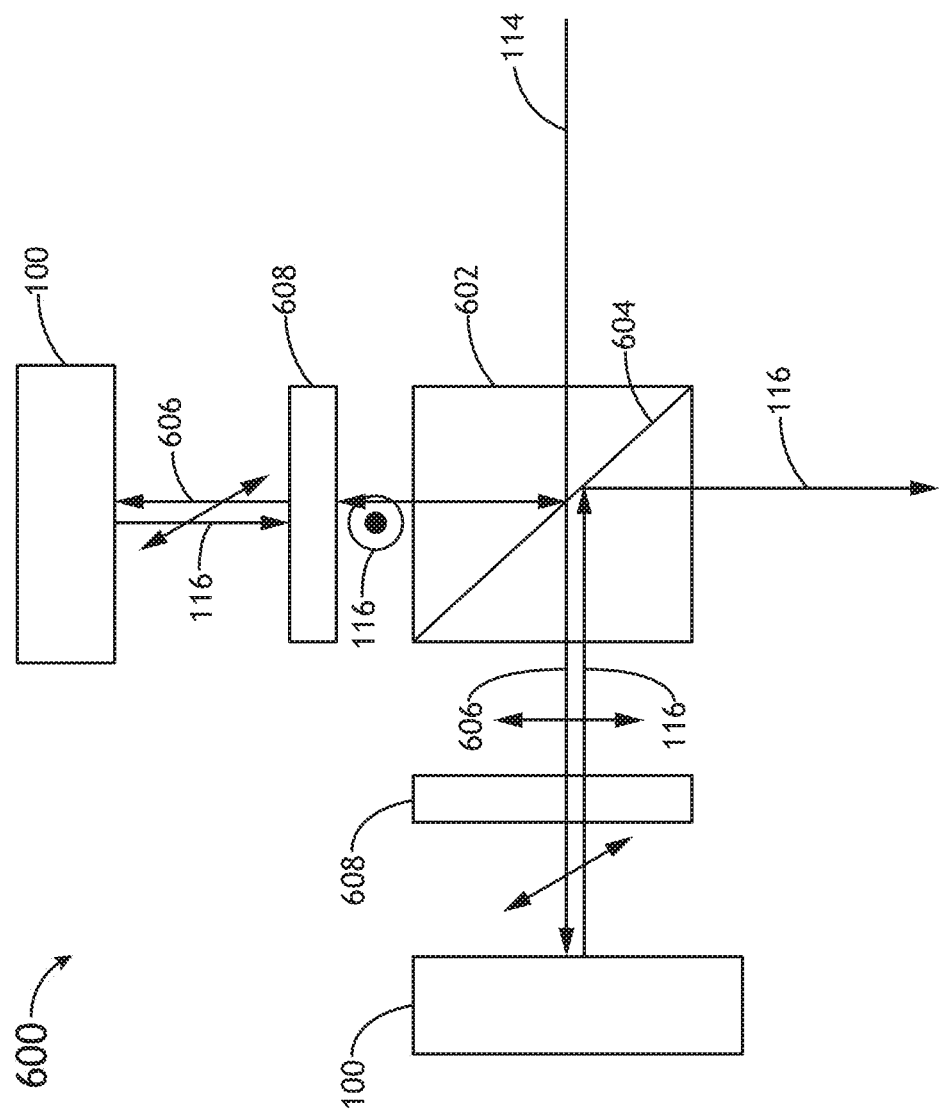
FIG. 6 is an optical assembly including a DMD, in accordance with one or more embodiments of the present disclosure.

In another embodiment, as illustrated in FIG. 6, an optical assembly 600 includes a set of DMD 100. The optical assembly 600 may include a prism 602. For example, the prism 602 may include, but is not limited to, a polarizing beam splitting cube (PBSC). The incoming light 114 may enter a surface of the prism 602 and be split by a beam splitter 604 within the prism 602 into split beams 606. A first split beam 606 may exit the prism 602 in a direction parallel to the incoming light 114 toward a first DMD 100, and a second split beam 606 may exit the prism 602 in a direction orthogonal to the incoming light 114 toward a second DMD 100.

The optical assembly 600 may include one or more wave plates 608. For example, the one or more wave plates 608 may include, but are not limited to, half wave plates. The first and second split beams 606 may pass through a respective first wave plate 608 or second wave plate 608. The first and second split beams 606 may be reflected by the respective first and second DMD 100 back toward the respective first and second wave plate 608. The first split beam 606 may pass through the first wave plate 608, enter the prism 602, and be directed by the beam splitter 604 to exit the prism 602 in a direction orthogonal to the incoming light 114 as reflected beams 116. The second split beam 606 may be directed by the second wave plate 608 in a direction orthogonal to the incoming light 114 as reflected beams 116.

It is noted herein the waveplate 608 may be configured to rotate the polarization so the two reflected beams 116 may be reflected or transmitted by the prism 602, and combined to propagate downward to interfere with each other. In this regard, the DMD 100 may be used to select a desired wave front to achieve selective interference. In addition, it is noted herein the optical assembly 600 in FIG. 6 may allow for piecewise programming.

It is noted herein that with an implementation of the DMD 100, an light path of the defect detection system may need to be redesigned due to a reflection nature of the DMD 100.

Figure 7A:
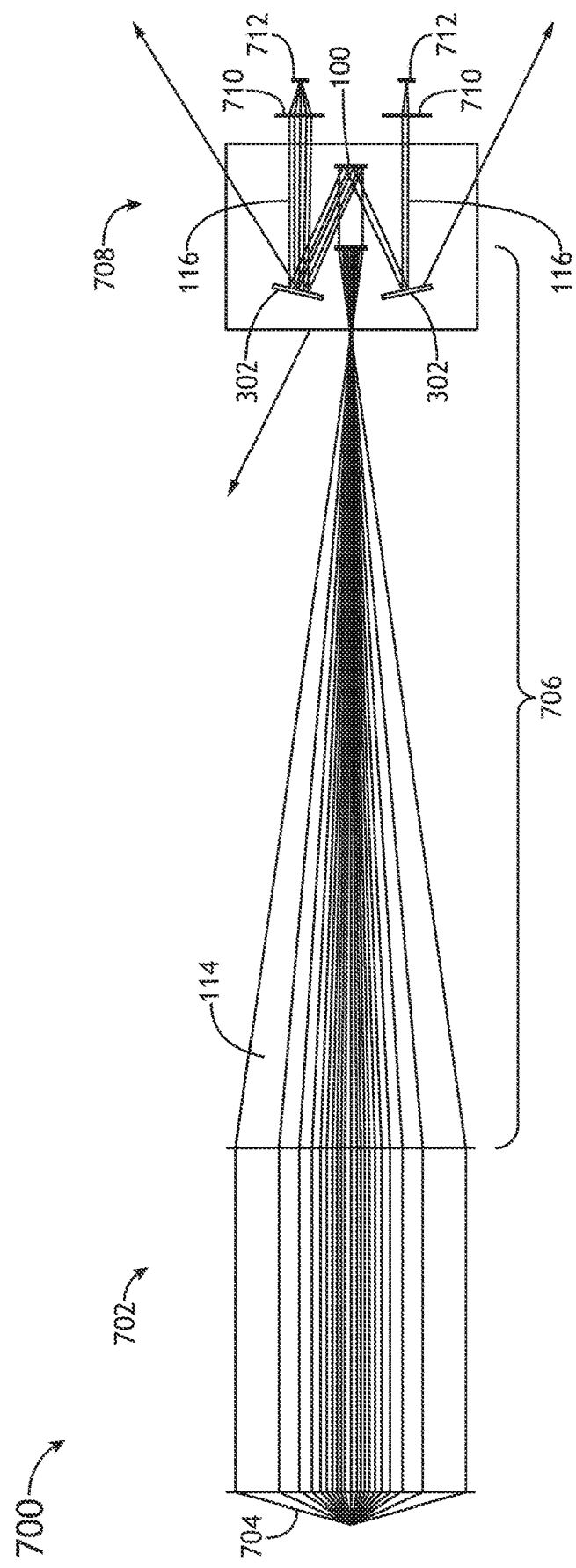
FIG. 7A is a defect detection system including a DMD, in accordance with one or more embodiments of the present disclosure.
Figure 7B:
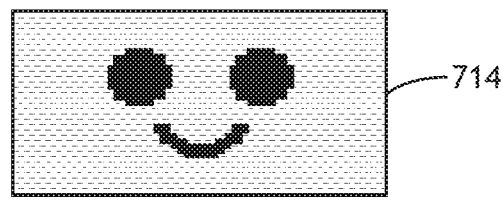
FIG. 7B is a graphical representation of a programmable and reconfigurable mask, in accordance with one or more embodiments of the present disclosure.
Figure 7B:
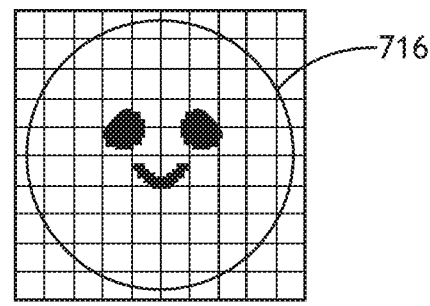
Figure 7B:
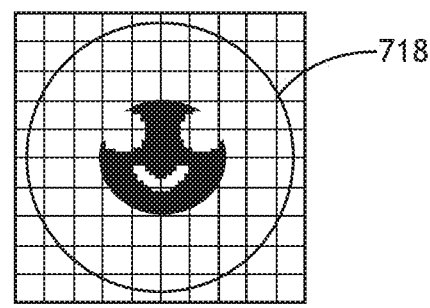

FIGS. 7A and 7B in general illustrate a simplified block diagram view of a defect detection system 700, in accordance with one or more embodiments of the present disclosure.

In one embodiment, the defect detection system 700 includes an light pathway 702. The light pathway 702 may include one or more lenses configured to collimate, direct, and relay the pupil of incoming light 114 to the DMD 100. For example, the light pathway 702 may include an objective lens 704. By way of another example, the light pathway 702 may include a pupil relay lens 706, or a telescope 706. For instance, the pupil relay lens 706 may be configured to adjust the beam size to match with an active area of the DMD 100 and relay the pupil from the objective lens 704 to further away, gaining more room to install the DMD 100 and achieve beam separation. It is noted herein the DMD 100 may be located at the relayed pupil plane by the pupil relay lens 706.

In another embodiment, the defect detection system 700 includes a detection pathway 708. The detection pathway may include an optical assembly (e.g., an optical assembly 300, 400, 500, 600). For example, the detection pathway 708 may include the one or more deflection mirrors 302 configured to receive the reflected beam 116 from the DMD 100. The detection pathway 708 may include one or more imaging lenses 710 configured to focus the reflected beam 116 into one or more image planes 712.

Although embodiments of the present disclosure are directed to the detection pathway 708 including the optical assembly, it is noted herein the optical assembly may be considered a portion of the light pathway 702, either instead of or in addition to being considered a portion of the detection pathway 708. Therefore, the above description should not be interpreted as a limitation on the present invention but merely an illustration.

In one example as illustrated in FIG. 7B, the DMD 100 of the defect detection system 700 may be programmed to form a smile face pattern 714. The mirrors 104 of the DMD 100 within the smile face pattern may be programmed to tilt in a first direction, while the mirrors 104 of the DMD 100 outside of the smile face pattern 714 may be programmed to tilt in a second direction. Through monitoring of the mirror planes of the branches of the detection pathway 708, two complimentary images 716, 718 may be observed. For instance, image 716 may be similar to the smile face pattern 714, while image 718 may be an inverse to the smile face pattern 714. In this regard, any complex shape and/or size of the mask may be programmed in the DMD 100, accelerating the mask optimization for the defect detection system 700, configured the masks for different customer requirements, and/or reducing development time for a mask set.

It is noted herein the defect detection system 700 is not limited to the illustrated arrangement of optical elements within the light pathway 702 and/or the detection pathway 708, and the light pathway 702 and/or the detection pathway 708 may include the same optical elements, more optical elements, or fewer optical elements in a different order than that illustrated. Therefore, the above description should not be interpreted as a limitation on the present disclosure but merely an illustration.

Figure 8A:
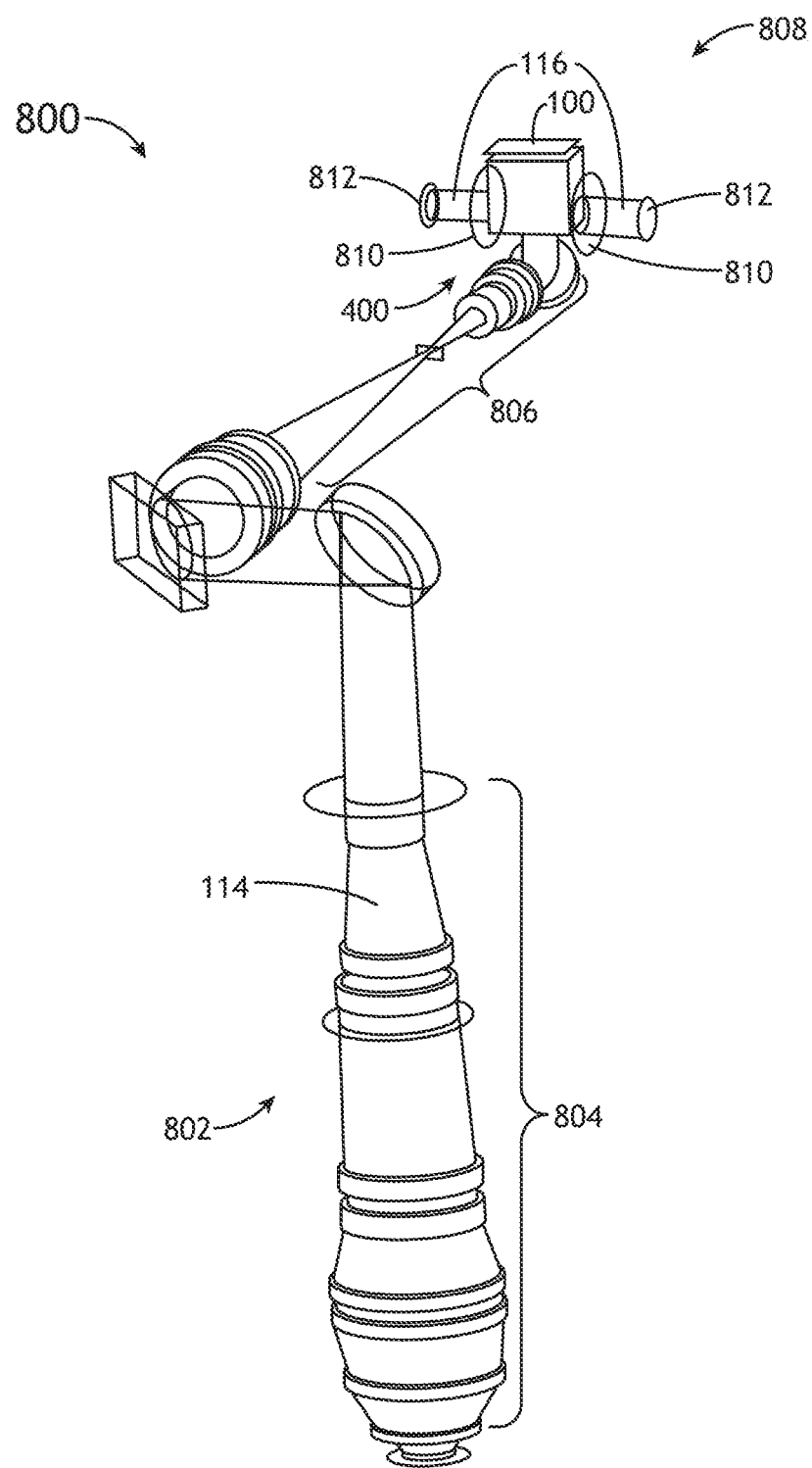
FIG. 8A is a defect detection system including a DMD, in accordance with one or more embodiments of the present disclosure.
Figure 8B:
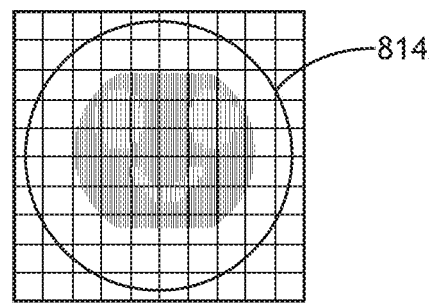
FIG. 8B is a graphical representation of a programmable and reconfigurable mask, in accordance with one or more embodiments of the present disclosure.
Figure 8B:
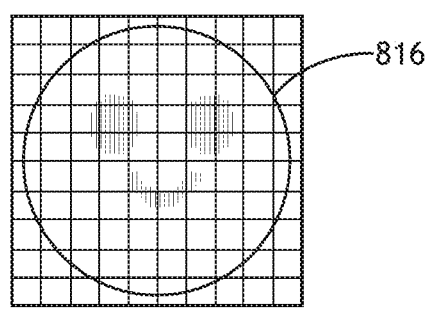
Figure 8B:
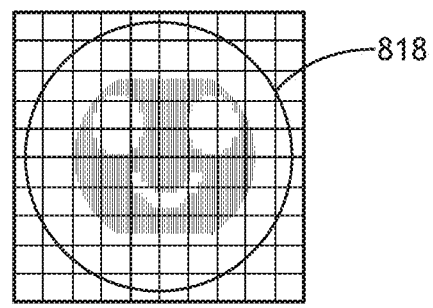

FIGS. 8A and 8B in general illustrate a defect detection system 800, in accordance with one or more embodiments of the present disclosure.

In one embodiment, the defect detection system 800 includes an light pathway 802. The light pathway 802 may include one or more lenses configured to direct incoming light 114 to the DMD 100. For example, the light pathway 802 may include one or more objective lenses 804. By way of another example, the light pathway 802 may include a pupil relay lens 806, or a telescope 806. It is noted herein the DMD 100 may be located at the relayed pupil plane by the pupil relay lens 806.

In another embodiment, the defect detection system 800 includes a detection pathway 808. The detection pathway may include an optical assembly (e.g., an optical assembly 300, 400, 500, 600). For example, the detection pathway 708 may include the optical assembly 400 including the prism 402 configured to receive the incoming light 114 and/or reflected beam 116 from the DMD 100. By way of another example, the detection pathway 708 may include one or more deflection mirrors 302 configured to receive the reflected beam 116 from the DMD 100.

The prism 402 may deflect the light 114 to create the reflected beams 116 and direct the deflected beams 116 sideways. The light 114 entering and passing through the prism 402 to the DMD 100 may experience almost no loss at the interfaces between prism sections of the prism 402, where incident angles at the interfaces are less than a total internal reflection (TIR) angle of the prism 402. A special coating may be applied to the interfaces to further reduce reflection loss. The prism 402 may be assembled with air gaps between interfaces of at least some of the adjacent prism sections.

The light 114 may be returned to the prism 402 from the DMD 100, where the beams 116 experience TIR due to the extra deflection introduced by the DMD, which may lead to the incident angle of the light 114 at the interfaces exceeding the TIR and becoming reflected beams 116 directed sideways out of the prism 402.

The detection pathway 808 may include one or more imaging lenses 810 configured to focus the reflected beam 116 into one or more image planes 812. The reflected beam 116 may be aligned perpendicular relative to the incoming light 114, such that the reflected beams 116 may be more easily received by/directed to downstage components of the defect detection system 800.

Although embodiments of the present disclosure are directed to the detection pathway 808 including the optical assembly, it is noted herein the optical assembly may be considered a portion of the light pathway 802, either instead of or in addition to being considered a portion of the detection pathway 808. Therefore, the above description should not be interpreted as a limitation on the present invention but merely an illustration.

In one example as illustrated in FIG. 8B, the DMD 100 of the defect detection system 800 may be programmed to form a smile face pattern 814. The mirrors 104 of the DMD 100 within the smile face pattern may be programmed to tilt in a first direction, while the mirrors 104 of the DMD 100 outside of the smile face pattern 814 may be programmed to tilt in a second direction. Through monitoring of the mirror planes of the branches of the detection pathway 808, two complimentary images 816, 818 may be observed. For instance, image 816 may be similar to the smile face pattern 814, while image 818 may be an inverse to the smile face pattern 814. In this regard, any complex shape and/or size of the mask may be programmed in the DMD 100, accelerating the mask optimization for the defect detection system 800, configured the masks for different customer requirements, and/or reducing development time for a mask set.

Unlike with FIGS. 7A and 7B, the pupil relay lens 806 illustrated in FIG. 8A is not illustrated as the beam size having been adjusted to match with an active area of the DMD 100, resulting in a truncation of the light 114 at the top and bottom side of the pupil (e.g., the cut off portion of images 816, 818. However, the defect detection system 800 may be configured to adjust the beam size to match with an active area of the DMD 100 and relay the pupil from the objective lens 804 to further away, gaining more room to install the DMD 100 and achieve beam separation.

It is noted herein the defect detection system 800 is not limited to the illustrated arrangement of optical elements within the light pathway 802 and/or the detection pathway 808, and the light pathway 802 and/or the detection pathway 808 may include the same optical elements, more optical elements, or fewer optical elements in a different order than that illustrated. Therefore, the above description should not be interpreted as a limitation on the present disclosure but merely an illustration.

In general, it is noted herein the layout of the optical assemblies 300, 400, 500, 600 and/or the defect detection systems 700, 800 are intended to be illustrative rather than limiting. Therefore, the above description should not be interpreted as a limitation on the present disclosure but merely an illustration.

Figure 9:
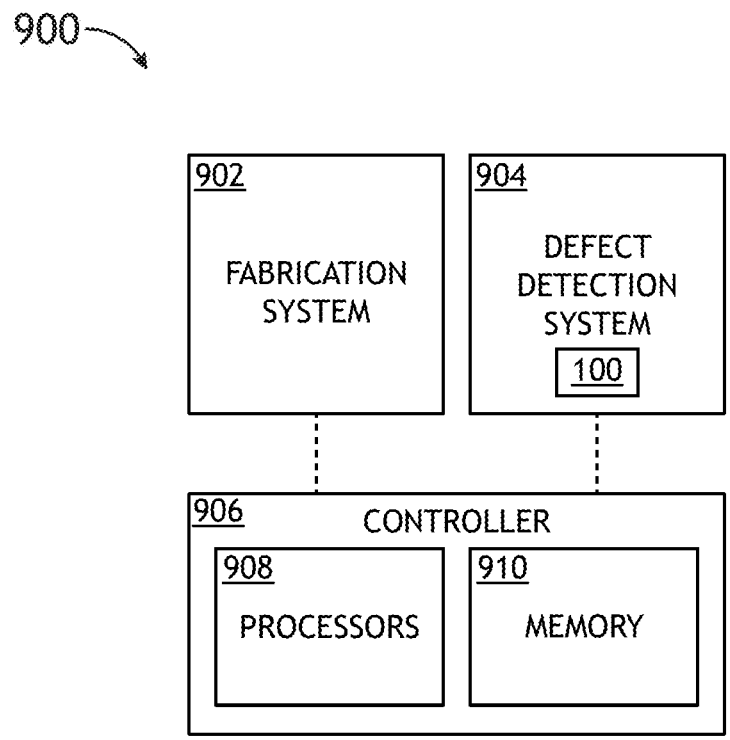
FIG. 9 is a system including a fabrication system, a defect detection system, and a controller, in accordance with one or more embodiments of the present disclosure.

FIG. 9 in general illustrates a system 900, in accordance with one or more embodiments of the present disclosure.

In one embodiment, the system 900 includes one or more fabrication systems 902 for lithographically imaging one or more pattern elements of a pattern mask (e.g., device pattern elements, or the like) on a sample. For the purposes of the present disclosure, it is noted herein that a fabrication system 902 may be referred to as a fabrication tool. For example, the fabrication system 902 may include any fabrication tool known in the art including, but not limited to, an etcher, scanner, stepper, cleaner, or the like. A fabrication process may include fabricating multiple dies distributed across the surface of a sample (e.g., a semiconductor wafer, or the like), where each die includes multiple patterned layers of material forming a device component. Each patterned layer may be formed by fabrication tools via a series of steps including material deposition, lithography, etching to generate a pattern of interest, and/or one or more exposure steps (e.g., performed by a scanner, a stepper, or the like). For purposes of the present disclosure, it is noted herein a fabrication system 902 may be a single fabrication tool or may represent a group of fabrication tools.

The fabrication system 902 may include an illumination source configured to generate an illumination beam. The one or more illumination beams may include one or more selected wavelengths of light including, but not limited to, ultraviolet (UV) radiation, DUV, extreme ultraviolet radiation (EUV), visible radiation, or infrared (IR) radiation.

Illumination from the illumination source may have any spatial distribution (e.g., illumination pattern). For example, the illumination source may include, but is not limited to, a single-pole illumination source, a dipole illumination source, a C-Quad illumination source, a Quasar illumination source, or a free-form illumination source. In this regard, the illumination source may generate on-axis illumination beams in which illumination propagates along (or parallel to) an optical axis and/or any number of off-axis illumination beams in which illumination propagates at an angle to the optical axis.

It is noted herein that, for the purposes of the present disclosure, an illumination pole of the illumination source may represent illumination from a specific location. In this regard, each spatial location of the illumination source (e.g., with respect to the optical axis) may be considered an illumination pole. Further, an illumination pole may have any shape or size known in the art. In addition, the illumination source may be considered to have an illumination profile corresponding to a distribution of illumination poles.

Further, the illumination source may generate the illumination beams by any method known in the art. For example, an illumination beam may be formed as illumination from an illumination pole of the illumination source (e.g., a portion of an illumination profile of an illumination source, or the like). By way of another example, the illumination source may include multiple illumination sources for the generation of multiple illumination beams.

The fabrication system 902 may include a set of projection optics configured to project an image of a programmable and reconfigurable pattern mask illuminated by the one or more illumination beams onto a sample disposed on a sample stage in order to generate printed pattern elements corresponding to the image of the pattern mask.

The sample may include any number of photosensitive materials and/or material layers suitable for receiving the image of the pattern mask. For example, the sample may include a resist layer. In this regard, the set of projection optics may project an image of the pattern mask onto the resist layer to expose the resist layer and a subsequent etching step may remove the exposed material (e.g., positive etching) or the unexposed material (e.g., negative etching) in order to provide printed features on the sample. Further, the pattern mask may be utilized in any imaging configuration known in the art. For example, the pattern mask may be a positive mask (e.g., a bright-field mask) in which pattern elements are positively imaged as printed pattern elements. By way of another example, the pattern mask may be a negative mask (e.g., a dark-field mask) in which pattern elements of the pattern mask form negative printed pattern elements (e.g., gaps, spaces, or the like).

In another embodiment, the system 900 includes one or more defect detection systems 904 to characterize one or more features on the sample. For example, the one or more defect detection systems 904 may include, but are not limited to, the defect detection system 700 or the defect detection system 800 and/or components of the defect detection system 700 or the defect detection system 800. The system 900 may incorporate characterization measurements at one or more points during a fabrication process to monitor and control the fabrication of features on a particular sample and/or across multiple samples. For example, the system 900 may incorporate characterization measurements to program and reconfigure a mask. For the purposes of the present disclosure, it is noted herein that a defect detection system 904 may be referred to as a characterization tool. For purposes of the present disclosure, it is noted herein a defect detection system 904 may be a single defect detection tool or may represent a group of defect detection tools.

In another embodiment, the defect detection system 904 includes an optical illumination source configured to generate an optical illumination beam. The optical illumination beam may include one or more selected wavelengths of radiation including, but not limited to, x-ray, UV light, DUV light, EUV light, visible light, or IR light. The optical illumination source may be any type of illumination source known in the art suitable for generating an optical illumination beam. In one embodiment, the optical illumination source is a laser source. For example, the optical illumination source may include, but is not limited to, one or more narrowband laser sources, a broadband laser source, a supercontinuum laser source, a white light laser source, or the like. In this regard, the optical illumination source may provide an optical illumination beam having high coherence (e.g., high spatial coherence and/or temporal coherence). In another embodiment, the optical illumination source includes a laser-sustained plasma (LSP) source. For example, the optical illumination source may include, but is not limited to, a LSP lamp, a LSP bulb, or a LSP chamber suitable for containing one or more elements that, when excited by a laser source into a plasma state, may emit broadband illumination. In another embodiment, the optical illumination source includes a lamp source. For example, the optical illumination source may include, but is not limited to, an arc lamp, a discharge lamp, an electrode-less lamp, or the like. In this regard, the optical illumination source may provide an optical illumination beam having low coherence (e.g., low spatial coherence and/or temporal coherence).

The optical illumination source may be configured to direct the optical illumination beam to a sample via an illumination pathway. The illumination pathway may include one or more illumination pathway lenses or additional optical components suitable for modifying and/or conditioning the optical illumination beam. For example, the one or more optical components may include, but are not limited to, one or more polarizers, one or more filters, one or more beam splitters, one or more diffusers, one or more homogenizers, one or more apodizers, or one or more beam shapers. The illumination pathway may further include an objective lens configured to direct the optical illumination beam to the sample.

In another embodiment, the sample is disposed on a sample stage. The sample stage may include any device suitable for positioning and/or scanning the sample within the defect detection system 904. For example, the sample stage may include any combination of linear translation stages, rotational stages, tip/tilt stages, or the like.

In another embodiment, defect detection system 904 includes a detector configured to capture light emanating from the sample through a collection pathway. The collection pathway may include, but is not limited to, one or more collection pathway lenses for collecting light from the sample. For example, a detector may receive light reflected or scattered (e.g., via specular reflection, diffuse reflection, and the like) from the sample via one or more collection pathway lenses. By way of another example, a detector may receive light generated by the sample (e.g., luminescence associated with absorption of the optical illumination beam, or the like). By way of another example, the detector may receive one or more diffracted orders of light from the sample (e.g., 0-order diffraction, ±1 order diffraction, 2 order diffraction, and the like).

The detector may include any type of detector known in the art suitable for measuring illumination received from the sample. For example, the detector may include, but is not limited to, a CCD detector, a TDI detector, a photomultiplier tube (PMT), an avalanche photodiode (APD), a complementary metal-oxide-semiconductor (CMOS) sensor, or the like. In another embodiment, the detector may include a spectroscopic detector suitable for identifying wavelengths of light emanating from the sample.

In one embodiment, the detector is positioned approximately normal to the surface of the sample. In another embodiment, the defect detection system 904 includes a beam splitter oriented such that the objective lens may simultaneously direct the optical illumination beam to the sample and collect light emanating from the sample. Further, the illumination pathway and the collection pathway may share one or more additional elements (e.g., objective lens, apertures, filters, or the like).

In another embodiment, the system 900 includes a controller 906 communicatively coupled to the fabrication system 902 and/or the defect detection system 904. The controller 906 may be configured to adjust the micro-mirrors 104 of the micro-mirror array 102 to program and reconfigure the DMD 100, causing the DMD 100 to direct the first portion of the incoming illumination 114 into a first illumination channel and the second portion of the incoming illumination 114 into a second illumination channel.

The controller 906 may include one or more processors 908 configured to execute program instructions maintained on memory medium 910. In this regard, the one or more processors 908 of controller 906 may execute any of the various process steps described throughout the present disclosure. Further, the controller 906 may be configured to receive data including, but not limited to, imagery data associated with the sample from the detector.

The one or more processors 908 of a controller 906 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 908 may include any device configured to execute algorithms and/or instructions (e.g., program instructions stored in memory). In one embodiment, the one or more processors 908 may be embodied as a desktop computer, mainframe computer system, workstation, image computer, parallel processor, networked computer, or any other computer system configured to execute a program configured to operate or operate in conjunction with the defect detection system 904, as described throughout the present disclosure.

Moreover, different subsystems of the system 900, such as the fabrication systems 902 and/or the defect detection systems 904 of the system 900, may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller 906 or, alternatively, multiple controllers. In addition, the controller 906 may include one or more controllers housed in a common housing or within multiple housings. In this way, any controller or combination of controllers may be separately packaged as a module suitable for integration into the defect detection system. Further, the controller 906 may analyze data received from the detector and feed the data to additional components within the defect detection system 904 or external to the defect detection system 904.

The memory medium 910 may include any storage medium known in the art suitable for storing program instructions executable by the associated one or more processors 908. For example, the memory medium 910 may include a non-transitory memory medium. By way of another example, the memory medium 910 may include, but is not limited to, a read-only memory (ROM), a random-access memory (RAM), a magnetic or optical memory device (e.g., disk), a magnetic tape, a solid-state drive and the like. It is further noted that memory medium 910 may be housed in a common controller housing with the one or more processors 908. In one embodiment, the memory medium 910 may be located remotely with respect to the physical location of the one or more processors 908 and controller 906. For instance, the one or more processors 908 of controller 906 may access a remote memory (e.g., server), accessible through a network (e.g., internet, intranet and the like).

In one embodiment, a user interface is communicatively coupled to the controller 906. In one embodiment, the user interface may include, but is not limited to, one or more desktops, laptops, tablets, and the like. In another embodiment, the user interface includes a display used to display data of the system 900 to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface is suitable for implementation in the present disclosure. In another embodiment, a user may input selections and/or instructions responsive to data displayed to the user via a user input device of the user interface.

In another embodiment, the controller 906 is communicatively coupled to one or more elements of the defect detection system 904. In this regard, the controller 906 may transmit and/or receive data from any component of the defect detection system 904. Further, the controller 906 may direct or otherwise control any component of the defect detection system 904 by generating one or more drive signals for the associated components (e.g., the one or more micro-mirrors 104 of the micro-mirror array 102 of the DMD 100). For example, the controller 906 may be communicatively coupled to the detector to receive one or more images from the detector.

Figure 10:
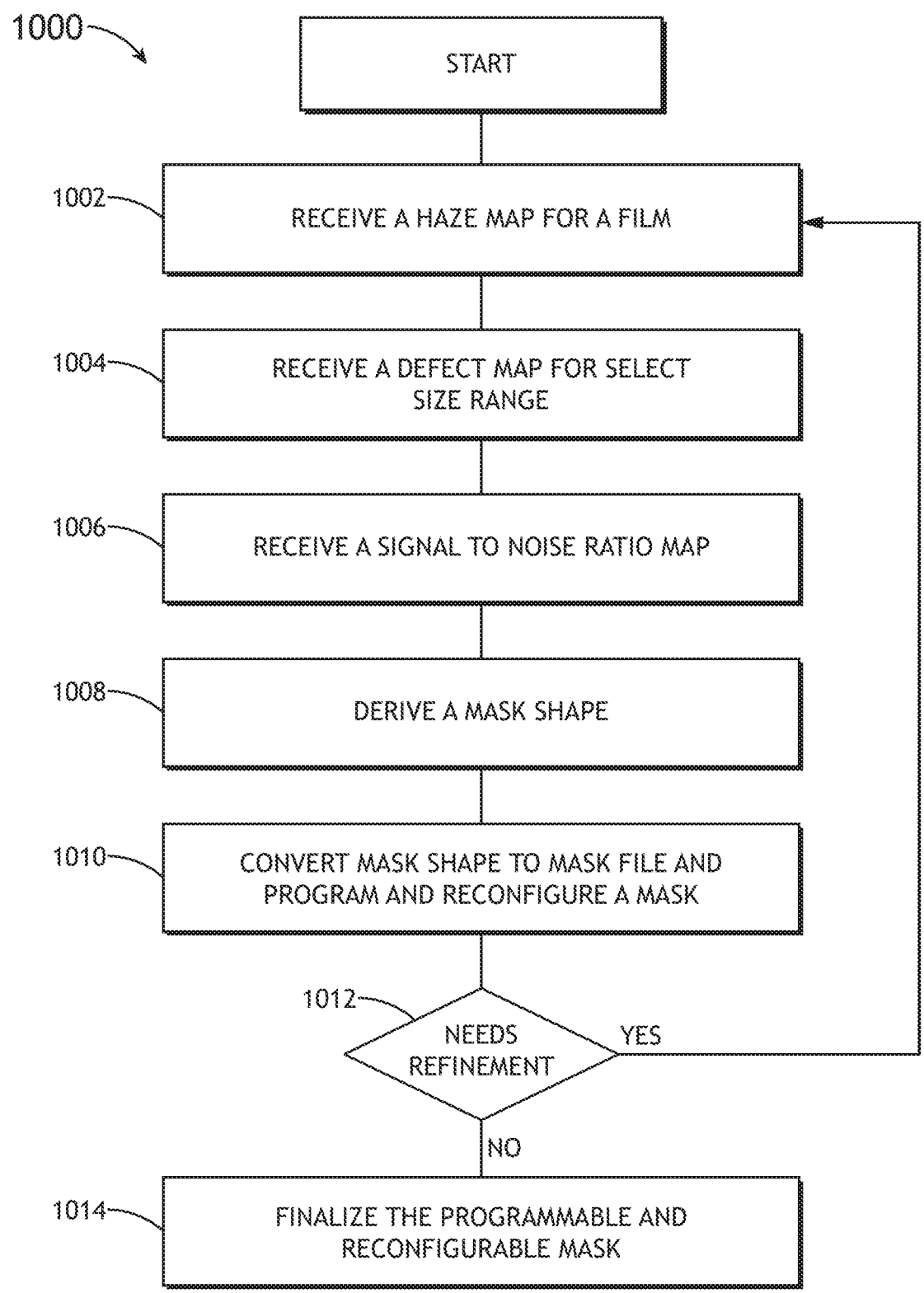
FIG. 10 is a flow diagram illustrating steps performed in a method for programming and reconfiguring a mask for defect detection, in accordance with one or more embodiments of the present disclosure.

FIG. 10 illustrates a method 1000 for programming and reconfiguring a mask for defect detection, in accordance with one or more embodiments of the present disclosure.

In a step 1002, a haze map for a film may be received. In a step 1004, a defect map may be received for the film for a select range of defect sizes. In a step 1006, a signal-to-noise ratio map may be received for the film. For example, one or more of the haze map, the defect map, or the signal-to-noise ratio map may be received from a defect detection system 904. For instance, the received information may be transmitted to a controller 906 coupled to the defect detection system 904, where the controller 906 is configured to program and reconfigure the DMD 100. By way of another example, one or more of the haze map, the defect map, or the signal-to-noise ratio map may be imported as a data set into a controller.

In a step 1008, a mask shape may be derived. For example, the mask shape may be derived from one or more of the haze map, the defect map, or the signal-to-noise ratio map. For example, the mask shape may be derived by determining hotspots in the signal-to-noise ratio map that align with hotspots in the defect map which do not take into account hotspots in the haze map. For instance, the signal-to-noise ratio map may be determined by removing (e.g., subtracting, or the like) the haze map from the defect map, and the mask shape may trace the remaining hotspots in the signal-to-noise ratio map.

In a step 1010, the mask shape may be converted into a mask file, and the derived mask shape may be used to program and reconfigure the mask. The mask shape may be used to program and reconfigure the DMD 100 to adjust one or more of the micro-mirrors 104 of the micro-mirror array 102 to be in a particular deflection state (e.g., the PD state, the ND state, or the S state). The mask file may be encrypted. The mask file may be shared between fabricators, customers, testers, or other individuals. The mask file may allow for an increased reproducibility of the programmable and reconfigurable mask. It is noted herein the mask shape may not need to be converted into the mask file for the derived mask shape to be used to program or reconfigure the mask. Therefore, the above description should not be interpreted as a limitation on the scope of the disclosure but merely an illustration.

In a step 1012, refinement may be considered for the programmable and reconfigurable mask. For example, a need for refinement may be determined based on a pre-determined threshold set by a manufacturer. If refinement is necessary, one or more of steps 1002, 1004, 1006, or 1008 may be performed.

In one example, refining the programmable and reconfigurable mask for defect detection may including loading the mask file into a DMD reconstruction simulator, separating the mask file into two branches, and evaluating a resultant wave front of the programmable and reconfigurable mask. Should the wave front not conform to the pre-determined threshold, refinement of the programmable and reconfigurable mask may be necessary.

In a step 1014, the programmable and reconfigurable mask may be finalized for use (e.g., within the system 900). The programmable and reconfigurable mask may be finalized following a determination that refinement is not necessary, per step 1012.

It is noted herein the programmable and reconfigurable mask may be formed online (e.g., in conjunction with the controller 906) or offline (e.g., as a standalone setting of the fabrication system 902 and/or the defect detection system 904). In addition, it is noted herein the programmable and reconfigurable mask may be implemented at any stage and/or by any individual (e.g., design, application, service, field maintenance, or the like) during a semiconductor fabrication and/or characterization process.

Further, it is noted herein the optimization of the programmable and reconfigurable mask may be automatic. For example, the optimization of the programmable and reconfigurable mask may be based on an input received via the controller 906 and/or an input received directly by the fabrication system 902 and/or the defect detection system 904. The inputs may be saved as individual encrypted files for protected sharing.

Further, it is noted herein the optimization of the programmable and reconfigurable mask may be accelerated in terms of mask development time.

Further, it is noted herein the programmable and reconfigurable mask may be customized in response to a particular film. For example, the programmable and reconfigurable mask may include any size of a range of sizes and/or any shape of a bank of shapes in response to the particular film.

Further, it is noted herein the programmable and reconfigurable mask may be tunable to allow for tool-to-tool matching and/or to allow for better defect classification. For example, the programmable and reconfigurable mask may be tuned without the need for component actuation (e.g., via driving or control systems including actuators, encoders, or the like).

It is noted herein the method or process 1000 is not limited to the steps and/or sub-steps provided. The method or process 1000 may include more or fewer steps and/or sub-steps. In addition, the method or process 1000 may perform the steps and/or sub-steps simultaneously. Further, the method or process 1000 may perform the steps and/or sub-steps sequentially, including in the order provided or an order other than provided. Therefore, the above description should not be interpreted as a limitation on the scope of the disclosure but merely an illustration.

It is noted herein that any language directed to a particular embodiment described in the present disclosure may be applicable to a different embodiment described in the present disclosure, such that the various embodiments described in the present disclosure should not be considered stand-alone or separate embodiments. For example, the present disclosure may be read as being able to combine any number of components from the optical assemblies 300, 400, 500, 600 as described throughout the present disclosure. By way of another example, the present disclosure may be read as being able to combine any number of components from the defect detection systems 800, 900 as described throughout the present disclosure. By way of another example, the present disclosure may be read as being able to combine any number of sample or target design processes, fabrication processes, and/or characterization measurement processes as described throughout the present disclosure. Therefore, the above description should not be interpreted as a limitation on the present disclosure but merely an illustration.

In this regard, the embodiments of the present disclosure illustrate a programmable and reconfigurable mask with a micro-electromechanical system (MEMS) micro-mirror array for defect detection. In general, the programmable and reconfigurable mask may be a digital micro-mirror device (DMD) in a compact system design, instead of requiring large metal sheets (e.g., linear sheets, rotary sheets, or the like) and corresponding driving or control systems (e.g., including actuators, encoders, or the like). The mask may be programmed and reconfigured online or offline and may include any size and/or shape of masks, which may be selected in response to a particular film.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," "temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A defect detection system comprising:
a programmable and reconfigurable digital micro-mirror device (DMD) including a micro-mirror array with a plurality of micro-mirrors, wherein at least some of the plurality of micro-mirrors are adjustable to achieve a first deflection state or a second deflection state, wherein the DMD is configured to receive incoming light and reflect a first portion of the incoming light into a first light channel corresponding to the first deflection state and a second portion of the incoming light into a second light channel corresponding to the second deflection state; and
at least one optical element, wherein the at least one optical element is optically coupled to the first light channel and the second light channel, wherein the at least one optical element is configured to deflect the first portion of the incoming light to a first imaging lens in the first light channel and a second portion of the incoming light to a second imaging lens in the second light channel, wherein the at least one optical element includes a prism, wherein the incoming light enters the prism via a first surface of the prism and exits the prism via a second surface of the prism onto the DMD, wherein the first portion of the incoming light reflected by the DMD enters the prism via the second surface of the prism into the first light channel and exits the prism via a third surface of the prism, wherein the second portion of the incoming light reflected by the DMD enters the prism via the second surface of the prism into the second light channel exits the prism via a fourth surface of the prism.

2. The defect detection system of claim 1, further comprising:
a controller communicatively coupled to the DMD, wherein the controller includes one or more processors configured to execute program instructions causing the one or more processors to:
receive at least one of a haze map, a defect map, or a signal-to-noise ratio (SNR) map;
derive a mask shape from the received at least one of the haze map, the defect map, or the SNR map; and
program and reconfigure the DMD based on the derived mask shape by adjusting at least some of the plurality of micro-mirrors of the DMD to achieve the first deflection state or the second deflection state.

3. The defect detection system of claim 1, wherein the at least one optical element includes a first deflection mirror optically coupled to the first illumination channel and a second deflection mirror optically coupled to the second light channel, wherein the first deflection mirror is configured to deflect the first portion of the incoming light to the first imaging lens, wherein the second deflection mirror is configured to deflect the second portion of the incoming light to the second imaging lens.

4. The defect detection system of claim 1, wherein the incoming light enters the first surface of the prism in a direction orthogonal to a direction in which the first portion of the incoming light reflected by the DMD exits the third surface of the prism and to a direction in which the second portion of the incoming light reflected by the DMD exists the fourth surface of the prism.

5. The defect detection system of claim 1, wherein the prism comprises at least one prism section.

6. The defect detection system of claim 5, wherein the prism includes a first prism section, a second prism section, and a third prism section.

7. The defect detection system of claim 6, wherein the incoming light passes through a first prism section and a second prism section prior to exiting the prism via the second surface of the prism onto the DMD.

8. The defect detection system of claim 6, wherein the incoming light passes through a first prism section, a second prism section, and a third prism section prior to exiting the prism via the second surface of the prism onto the DMD.

9. The defect detection system of claim 6, wherein the first portion of the incoming light reflected by the DMD is further reflected by a first tilt surface of the prism within the first light channel, wherein the first tilt surface separates a first prism section of the prism and a second prism section of the prism, wherein the first portion of the incoming light reflected by the DMD is further reflected by a second tilt surface of the prism within the second light channel, wherein the second tilt surface separates the second prism section of the prism and a third prism section of the prism.

10. The defect detection system of claim 6, wherein the first portion of the incoming light reflected by the DMD is further reflected by a first tilt surface of the prism within the first light channel, wherein the first tilt surface separates a first prism section of the prism and a second prism section of the prism, wherein the first portion of the incoming light reflected by the DMD is further reflected by a second tilt surface of the prism within the second light channel, wherein the second tilt surface separates the first prism section of the prism and a third prism section of the prism.

11. The defect detection system of claim 1, wherein the DMD is set parallel to the second surface of the prism.

12. The defect detection system of claim 1, wherein the DMD is set at an angle relative to the second surface of the prism.

13. The defect detection system of claim 1, wherein the incoming light enters the prism via a first surface of the prism and exits the prism via a second surface of the prism onto the DMD, wherein the first portion of the incoming light reflected by the DMD enters the prism via the second surface of the prism into the first light channel and exits the prism via the first surface of the prism, wherein the second portion of the incoming light reflected by the DMD enters the prism via the second surface of the prism into the second light channel exits the prism via a third surface of the prism.

14. The defect detection system of claim 13, wherein the incoming light enters the first surface of the prism in a direction opposite to a direction in which the first portion of the incoming light reflected by the DMD exits the first surface of the prism and orthogonal to a direction in which the second portion of the incoming light reflected by the DMD exists the third surface of the prism.

15. The defect detection system of claim 1, wherein the at least one optical element includes a first auxiliary prism in the first light channel and a second auxiliary prism in the second light channel, wherein the first auxiliary prism receives the first portion of the incoming light from the prism and separates the first portion of the incoming light into a first auxiliary reflected beam and a second auxiliary reflected beam, wherein the first auxiliary prism receives the second portion of the incoming light from the prism and separates the second portion of the incoming light into a third auxiliary reflected beam and a fourth auxiliary reflected beam.

16. A defect detection system comprising:
a programmable and reconfigurable digital micro-mirror device (DMD) including a micro-mirror array with a plurality of micro-mirrors, wherein at least some of the plurality of micro-mirrors are adjustable to achieve a first deflection state or a second deflection state, wherein the DMD is configured to receive a first portion of incoming light via a first light channel corresponding to the first deflection state and a second portion of incoming light via a second light channel corresponding to the second deflection state, wherein the DMD is configured to combine the first portion of the incoming light and the second portion of the incoming light, wherein the DMD is configured to reflect the combined first portion of the incoming light and second portion of the incoming light into a third light channel; and
at least one optical element, wherein the at least one optical element is optically coupled to the first light channel, the second light channel, and the third light channel, wherein the at least one optical element is configured to reflect the combined first portion of the incoming light and second portion of the incoming light to an imaging lens in the third light channel, wherein the at least one optical element includes a prism, wherein the incoming light enters the prism via a first surface of the prism and exits the prism via a second surface of the prism onto the DMD, wherein the first portion of the incoming light reflected by the DMD enters the prism via the second surface of the prism into the first light channel and exits the prism via a third surface of the prism, wherein the second portion of the incoming light reflected by the DMD enters the prism via the second surface of the prism into the second light channel exits the prism via a fourth surface of the prism.

17. A defect detection system comprising:
a first programmable and reconfigurable digital micro-mirror device (DMD) and a second programmable and reconfigurable DMD, wherein at least some of the first DMD and the second DMD includes a micro-mirror array with a plurality of micro-mirrors, wherein at least some of the plurality of micro-mirrors of the first DMD and the second DMD are adjustable to achieve a first deflection state or a second deflection state, wherein the first DMD is configured to receive a first portion of incoming light corresponding to the first deflection state via a first light channel, wherein the second DMD is configured to receive a second portion of the incoming light corresponding to the second deflection state via a second light channel; and
a plurality of optical elements, wherein the plurality of optical elements includes:
a prism, wherein the prism is optically coupled to the first light channel and the second light channel, wherein the prism includes a beam splitter configured to split the incoming light into the first portion of the incoming light and the second portion of incoming light;
a first wave plate within the first light channel, wherein the first wave plate is configured to receive the first portion of the incoming light from the prism and direct the first portion of the incoming light to the first DMD; and
a second wave plate within the second light channel, wherein the second wave plate is configured to receive the second portion of the incoming light from the prism and direct the second portion of the incoming light to the second DMD.

18. A defect detection system comprising:
a controller communicatively coupled to a programmable and reconfigurable digital micro-mirror device (DMD), wherein the controller includes one or more processors configured to execute program instructions causing the one or more processors to:
receive at least one of a haze map, a defect map, or a signal-to-noise ratio (SNR) map;
derive a mask shape from the received at least one of the haze map, the defect map, or the SNR map; and
program and reconfigure the DMD by adjusting at least some of a plurality of micro-mirrors of the DMD to achieve a first deflection state or a second deflection state,
wherein the DMD is configured to receive incoming light and reflect a first portion of the incoming light into a first light channel corresponding to the first deflection state and a second portion of the incoming light into a second light channel corresponding to the second deflection state,
wherein at least one optical element is optically coupled to the first light channel and the second light channel, wherein the at least one optical element is configured to deflect the first portion of the incoming light to a first imaging lens in the first light channel and a second portion of the incoming light to a second imaging lens in the second light channel, wherein the at least one optical element includes a prism, wherein the incoming light enters the prism via a first surface of the prism and exits the prism via a second surface of the prism onto the DMD, wherein the first portion of the incoming light reflected by the DMD enters the prism via the second surface of the prism into the first light channel and exits the prism via a third surface of the prism, wherein the second portion of the incoming light reflected by the DMD enters the prism via the second surface of the prism into the second light channel exits the prism via a fourth surface of the prism.

19. A method comprising:

receiving at least one of a haze map, a defect map, or a signal-to-noise ratio (SNR) map;

deriving a mask shape from the received at least one of the haze map, the defect map, or the SNR map; and programming and reconfiguring a digital micro-mirror device (DMD) based on the derived mask shape by adjusting at least some of a plurality of micro-mirrors of the DMD to achieve a first deflection state or a second deflection state, wherein the DMD is configured to receive incoming light and reflect a first portion of the incoming light into a first light channel corresponding to the first deflection state and a second portion of the incoming light into a second light channel corresponding to the second deflection state, wherein at least one optical element is optically coupled to the first light channel and the second light channel, wherein the at least one optical element is configured to deflect the first portion of the incoming light to a first imaging lens in the first light channel and a second portion of the incoming light to a second imaging lens in the second light channel, wherein the at least one optical element includes a prism, wherein the incoming light enters the prism via a first surface of the prism and exits the prism via a second surface of the prism onto the DMD, wherein the first portion of the incoming light reflected by the DMD enters the prism via the second surface of the prism into the first light channel and exits the prism via a third surface of the prism, wherein the second portion of the incoming light reflected by the DMD enters the prism via the second surface of the prism into the second light channel exits the prism via a fourth surface of the prism.

* * * * *